(12) United States Patent
Yoda et al.

(10) Patent No.: US 7,245,524 B2
(45) Date of Patent: Jul. 17, 2007

(54) MAGNETIC MEMORY DEVICE AND WRITE METHOD OF MAGNETIC MEMORY DEVICE

(75) Inventors: Hiroaki Yoda, Sagamihara (JP); Tadashi Kai, Tokyo (JP); Masahiko Nakayama, Fuchu (JP); Sumio Ikegawa, Musashino (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 82 days.

(21) Appl. No.: 11/255,111

(22) Filed: Oct. 21, 2005

(65) Prior Publication Data
US 2006/0198184 A1    Sep. 7, 2006

(30) Foreign Application Priority Data
Feb. 25, 2005    (JP) .............................. 2005-050625

(51) Int. Cl.
*G11C 11/00* (2006.01)
(52) U.S. Cl. ...................... 365/158; 365/172; 365/173
(58) Field of Classification Search ................ 365/158, 365/171, 172, 173, 145
See application file for complete search history.

(56) References Cited

U.S. PATENT DOCUMENTS 6,052,302 A * 4/2000 Moyer et al. ................ 365/173
6,879,475 B2 * 4/2005 Kishi et al. ............... 360/324.2
2006/0238191 A1 * 10/2006 Saito ........................... 324/252

OTHER PUBLICATIONS

D. C. Worledge, "Magnetic phase diagram of two identical coupled nanomagnets", Applied Physics Letters, vol. 84, No. 15, Apr. 12, 2004, pp. 2847-2849.
M. Durlam, et al., "A 0.18μm 4Mb Toggling MRAM", IEDM Tech. Dig. 2003, pp. 995-997.

* cited by examiner

*Primary Examiner*—Richard T. Elms
*Assistant Examiner*—Hien N Nguyen
(74) *Attorney, Agent, or Firm*—Oblon, Spivak, McClelland, Maier & Neustadt, P.C.

(57) ABSTRACT

A magnetic memory device includes a first write wiring which runs in a first direction, a second write wiring which runs in a second direction different from the first direction, and a magnetoresistive element which is arranged at an intersection between the first and second write wirings, has a fixed layer, a recording layer, and a magnetoresistive layer sandwiched between the fixed layer and the recording layer, and has an axis of easy magnetization obliquely with respect to the first and second directions, the recording layer including a first ferromagnetic layer, a second ferromagnetic layer, and a first nonmagnetic layer sandwiched between the first and second ferromagnetic layers, in which first magnetization of the first ferromagnetic layer and second magnetization of the second ferromagnetic layer are ferromagnetically coupled, and a ferro-coupling constant C of a ferromagnetic coupling is 0.0001 erg/cm$^2$ ≦ C ≦ 0.2 erg/cm$^2$.

23 Claims, 18 Drawing Sheets

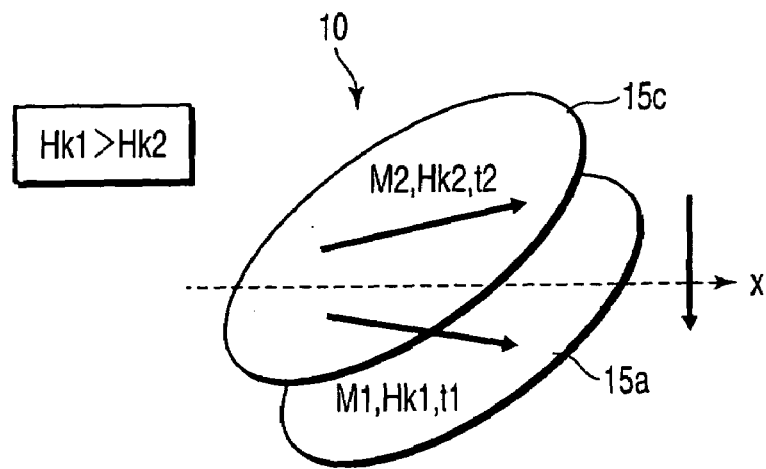
Case 1:
Hkint1 > Hkint2
Case 2:
M1 > M2
Case 3:
t1 > t2
F I G. 6
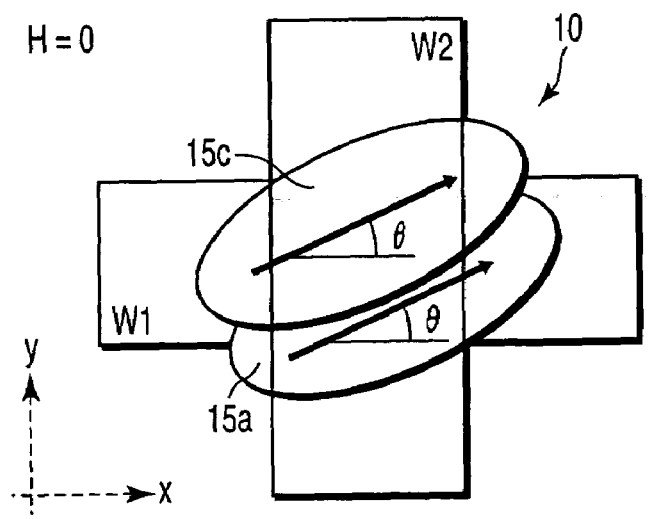
F I G. 7 j: exchange couplin
hi: intrinsic anisotropy
nx: dimagnetization factor in x direction
ny: dimagnetization factor in y direction

MAGNETIC MEMORY DEVICE AND WRITE METHOD OF MAGNETIC MEMORY DEVICE

CROSS-REFERENCE TO RELATED APPLICATIONS

This application is based upon and claims the benefit of priority from prior Japanese Patent Application No. 2005-050625, filed Feb. 25, 2005, the entire contents of which are incorporated herein by reference.

BACKGROUND OF THE INVENTION

1. Field of the Invention

The present invention relates to a magnetic memory device and a write method of the magnetic memory device and, more particularly, to a magnetic random access memory (MRAM) and a write method of it.

2. Description of the Related Art

Magnetic random access memories (MRAMs) are expected as ultimate memories with nonvolatility, high speed, large capacity, and low voltage driving and developed.

For conventional magnetic random access memories, however, it is becoming clear that the capacity can hardly be increased because the write current value increases as the circuit is micropatterned, and the write margin which is small inherently further decreases as the circuit is micropatterned.

To increase the write margin, a magnetic random access memory using toggle switching is proposed (e.g., M. Durlam, et al M,. IEDM Tech. Dig., pp. 995–997, 2003). In this toggle switching method, a synthetic recording layer which almost always has an anti-parallel magnetization arrangement is used as the recording layer of a magnetic tunnel junction (MTJ) element. The write margin is increased by using the spin flop phenomenon (A and B in FIG. 21).

However, according to the toggle switching method, when the short length of the MTJ element is 400 nm, the write current value increases by about 10 mA even when an efficient yoke wiring coated with a magnetic thin film is used.

In micropatterning, to ensure nonvolatility, the decrease in volume of memory cells must be compensated for by increasing the memory energy per unit volume. This results in an increase in reversal field of the recording layer of the MTJ element. As a result, the write current value further increases. When the short length of the MTJ element is about 150 nm, the necessary write current value exceeds the limit of electromigration of the wiring. Hence, a breakthrough is necessary for more advanced micropatterning. Assume that the variation in reversal field largely decreases, and the write current value can be reduced to 4 mA. Even in this case, when the write wiring width is reduced to about 140 nm as the MTJ element is micropatterned, the current density is about 107 A/cm$^2$. This exceeds 106 A/cm$^2$, e.g., the migration tolerance of a Cu wiring. Even in pulse driving, the current density reaches the allowable value limit (the wiring thickness is estimated 280 nm because the aspect ratio is about 2 at maximum in the normal wiring process). Generally, the short length of the MTJ element is set to be almost the same as the write wiring width. Hence, the limit of the short length of the MTJ element is also about 140 nm.

As described above, the most important challenges in the conventional magnetic random access memories are to maintain nonvolatility, reduce the reversal field of the recording layer of the MTJ element, and reduce the write current value to achieve high integration.

BRIEF SUMMARY OF THE INVENTION

According to a first aspect of the present invention, there is provided a magnetic memory device comprising a first write wiring which runs in a first direction, a second write wiring which runs in a second direction different from the first direction, and a magnetoresistive element which is arranged at an intersection between the first write wiring and the second write wiring, has a fixed layer, a recording layer, and a magnetoresistive layer sandwiched between the fixed layer and the recording layer, and has an axis of easy magnetization obliquely with respect to the first direction and second direction, the recording layer including a first ferromagnetic layer, a second ferromagnetic layer, and a first nonmagnetic layer sandwiched between the first ferromagnetic layer and the second ferromagnetic layer, in which first magnetization of the first ferromagnetic layer and second magnetization of the second ferromagnetic layer are ferromagnetically coupled, and a ferro-coupling constant C of a ferromagnetic coupling is 0.0001 erg/cm$^2 \leq C \leq$ 0.2 erg/cm$^2$.

According to a second aspect of the present invention, there is provided a write method of a magnetic memory device which comprises a first write wiring which runs in a first direction, a second write wiring which runs in a second direction different from the first direction, and a magnetoresistive element which is arranged at an intersection between the first write wiring and the second write wiring, has a fixed layer, a recording layer, and a magnetoresistive layer sandwiched between the fixed layer and the recording layer, and has an axis of easy magnetization obliquely with respect to the first direction and second direction, the recording layer including a first ferromagnetic layer, a second ferromagnetic layer, and a first nonmagnetic layer sandwiched between the first ferromagnetic layer and the second ferromagnetic layer, in which first magnetization of the first ferromagnetic layer and second magnetization of the second ferromagnetic layer are ferromagnetically coupled, and a ferro-coupling constant C of a ferromagnetic coupling is 0.0001 erg/cm$^2 \leq C \leq$ 0.2 erg/cm$^2$, comprising rotating the first magnetization and second magnetization in reverse directions to reverse the first magnetization and second magnetization, by supplying a first current and second current to the first write wiring and second write wiring, respectively, to apply magnetic fields by the first current and second current to the magnetoresistive element.

According to a third aspect of the present invention, there is provided a magnetic memory device comprising a first wiring which runs in a first direction, a select transistor which feeds spin-polarized electrons, a second wiring which runs in a second direction different from the first direction and which is selected by the select transistor, and a magnetoresistive element which is arranged at an intersection between the first wiring and the second wiring, has a first fixed layer, a recording layer, and a first magnetoresistive layer sandwiched between the first fixed layer and the recording layer, the recording layer including a first ferromagnetic layer, a second ferromagnetic layer, and a first nonmagnetic layer sandwiched between the first ferromagnetic layer and the second ferromagnetic layer, in which first magnetization of the first ferromagnetic layer and second magnetization of the second ferromagnetic layer are ferromagnetically coupled, a ferro-coupling constant C of a ferromagnetic coupling is 0.0001 erg/cm² ≤ C ≤ 0.2 erg/cm², and which is injected the spin-polarized electrons in writing.

BRIEF DESCRIPTION OF THE SEVERAL VIEWS OF THE DRAWING

FIG. 6 is a view showing an example of a means for generating different anisotropy magnetic fields in two ferrocoupled ferromagnetic layers of a recording layer according to the embodiment of the present invention;

FIG. 7 is a view for explaining an angle θ of oblique arrangement of the MTJ element according to the embodiment of the present invention;

DETAILED DESCRIPTION OF THE INVENTION

Figure 1:
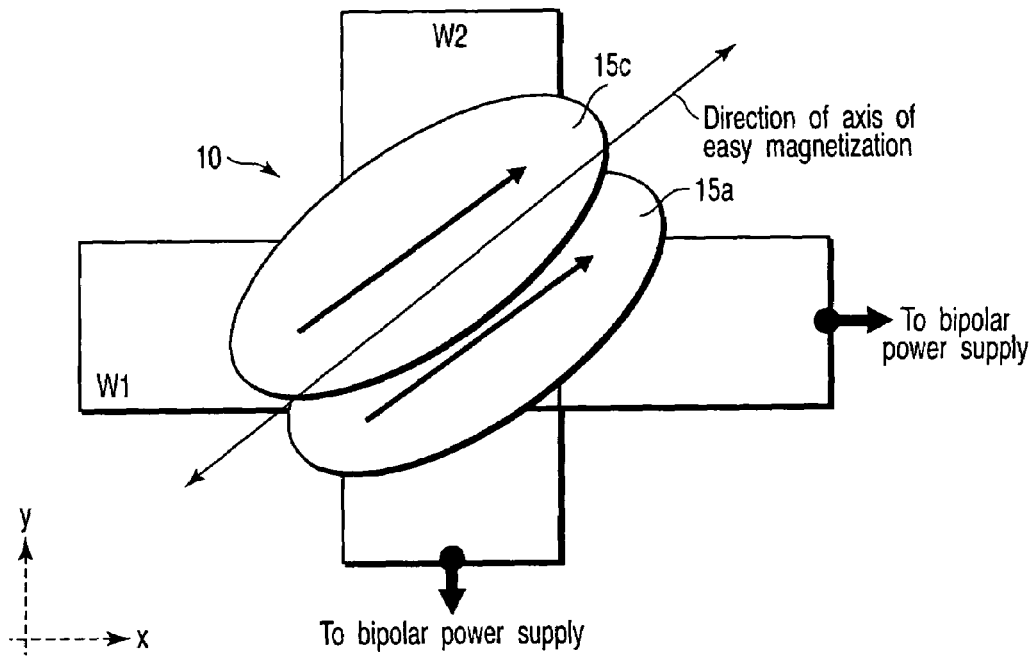
FIG. 1 is a schematic partial plan view showing the basic structure of a cell of a magnetic random access memory according to an embodiment of the present invention.

The embodiment of the present invention will be described below with reference to the accompanying drawing. The same reference numerals denote the same parts throughout the drawing.

[1] Outline of Basic Structure

Figure 2:
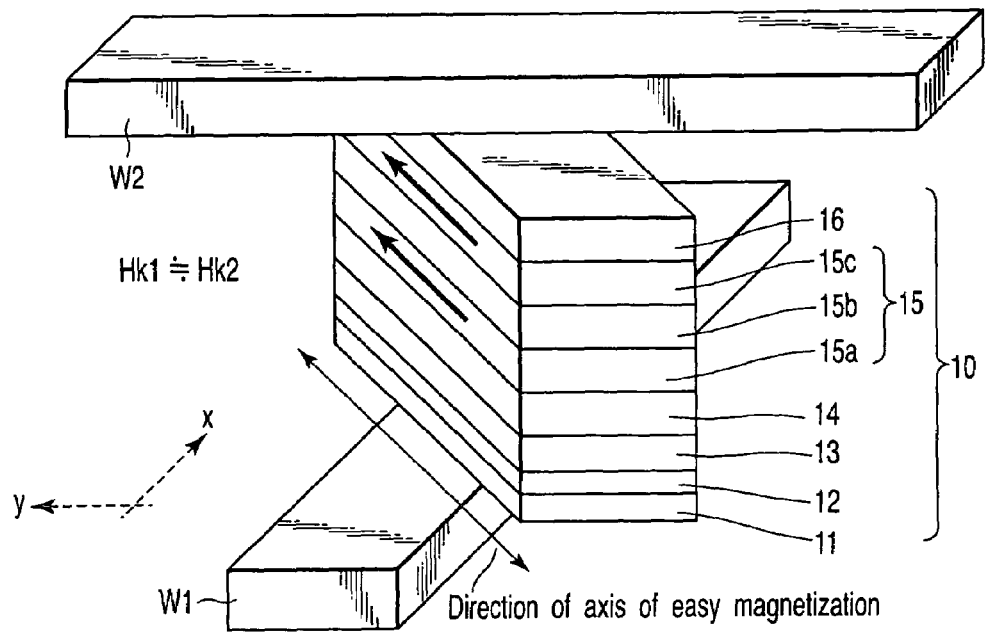
FIG. 2 is a schematic partial sectional view showing the basic structure of a cell of the magnetic random access memory according to the embodiment of the present invention.

FIG. 1 is a schematic partial plan view showing the basic structure of a cell of a magnetic random access memory (MRAM) according to an embodiment of the present invention. FIG. 2 is a schematic partial sectional view showing the basic structure of a cell of the magnetic random access memory according to the embodiment of the present invention. The outline of the basic structure of the magnetic random access memory according to the embodiment of the present invention will be described below.

As shown in FIG. 1, a first write wiring (e.g., word line) W1 runs in the X-axis direction. A second write wiring (e.g., bit line) W2 runs in the Y-axis direction (e.g., direction perpendicular to the X-axis direction). A magnetic tunnel junction (MTJ) element 10 serving as a magnetoresistive element is arranged at the intersection of the first write wiring W1 and the second write wiring W2 between them. The direction of axis of easy magnetization of the MTJ element 10 tilts with respect to the running directions (X- and Y-axis directions) of the first write wiring W1 and second write wiring W2.

As shown in FIG. 2, the MTJ element 10 includes a seed electrode layer 11, magnetization fixation layer 12, magnetization fixed layer 13, tunnel barrier layer 14, recording layer 15, and cap layer 16.

The recording layer 15 has a first ferromagnetic layer 15a, second ferromagnetic layer 15c, and nonmagnetic layer 15b sandwiched between the first and second ferromagnetic layers 15a and 15c. Magnetizations of the first and second ferromagnetic layers 15a and 15c have weak ferromagnetic coupling (ferro-coupling). When the applied field is zero (unselected state), the magnetization directions of the first and second ferromagnetic layers 15a and 15c are almost parallel (same direction). That is, the recording layer 15 has a synthetic structure in which a parallel magnetization arrangement is obtained when the applied field is zero.

In a write, different anisotropy magnetic fields Hk1 and Hk2 are generated in the first and second ferromagnetic layers 15a and 15c such that the magnetizations of the first and second ferromagnetic layers 15a and 15c with respect to the applied field are rotated in opposite directions and reversed. The write sequence is executed by supplying a predetermined write current.

The basic structure will be described below in detail.

[2] Write Method

[2-1] Write Sequence

Figure 3:
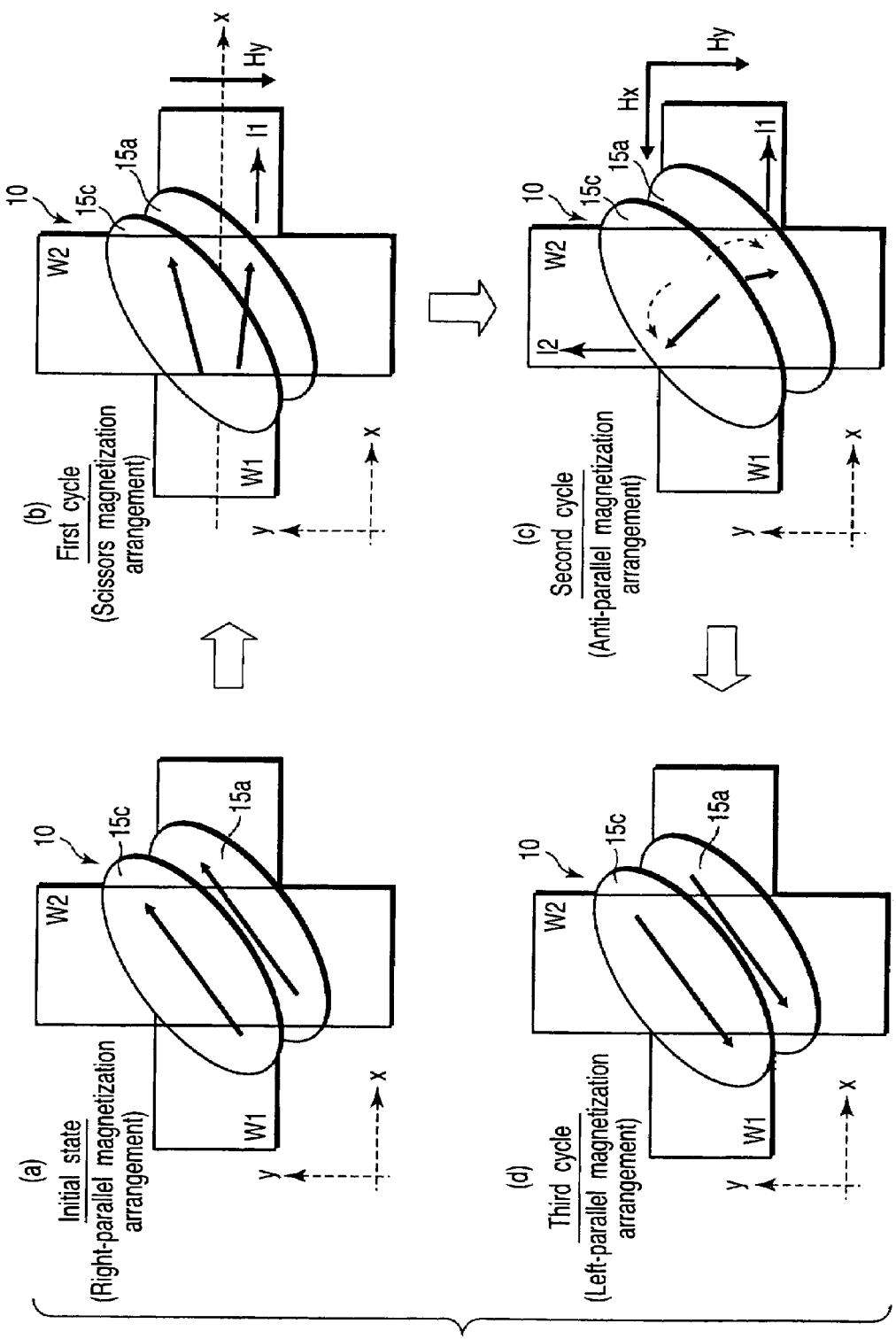
FIG. 3 is a view showing the write method of the magnetic random access memory according to the embodiment of the present invention.

FIG. 3 shows the write method of the magnetic random access memory according to the embodiment of the present invention. The schematic write sequence of the magnetic random access memory according to the embodiment of the present invention will be described.

As shown in FIG. 3(a), in the initial state, the applied field is zero because neither a write current I1 nor I2 flows to the first and second write wirings W1 and W2. In this case, the magnetizations of the first and second ferromagnetic layers 15a and 15c of the recording layer 15 are parallel and are directed to the right. This state will be called "right-parallel magnetization arrangement".

Next, as shown in FIG. 3(b), in the first cycle, the write current I1 is supplied to the first write wiring W1 of the first and second write wirings W1 and W2 (the first write wiring is turned on). An applied field Hy generated by the write current I1 acts on the magnetizations of the first and second ferromagnetic layers 15a and 15c of the recording layer 15. At this time, when the current value of the write current I1 is appropriately set, the magnetizations of the first and second ferromagnetic layers 15a and 15c of the recording layer 15 sandwich the first write wiring W1 (X-axis) in the ON state. This state is called a "scissors magnetization arrangement".

As shown in FIG. 3(c), in the second cycle, the write current I2 is supplied to even the other write wiring W2 of the first and second write wirings W1 and W2 (the second write wiring is turned on). A synthetic field by the applied fields Hy and Hx generated by the write currents I1 and I2 acts on the magnetizations of the first and second ferromagnetic layers 15a and 15c of the recording layer 15. As a result, the magnetization of the first ferromagnetic layer 15a rotates clockwise, and the magnetization of the second ferromagnetic layer 15c rotates counterclockwise. The magnetizations of the first and second ferromagnetic layers 15a and 15c rotate in reverse directions and become almost anti-parallel (directed in reverse directions). This state is called an "anti-parallel magnetization arrangement".

As shown in FIG. 3(d), in the third cycle, supply of the write currents I1 and I2 to the first and second write wirings W1 and W2 is stopped. The magnetizations of the first and second ferromagnetic layers 15a and 15c of the recording layer 15 are going to return to the stable state (parallel state) by the function of ferromagnetic coupling. As a result, the magnetizations of the first and second ferromagnetic layers 15a and 15c become parallel and are directed to the left reverse to the initial state. This state is called a "left-parallel magnetization arrangement".

Figure 21:
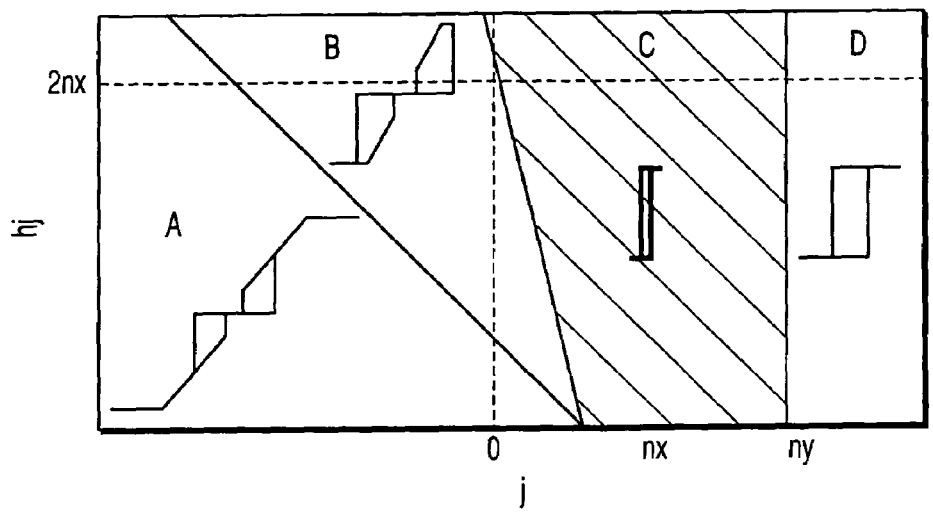
FIG. 21 is a view showing positioning of the write method of the magnetic random access memory according to the embodiment of the present invention.

By the above-described write sequence, the magnetization of the recording layer 15 can be reversed from the right-parallel magnetization arrangement to the left-parallel magnetization arrangement. When the right- and left-parallel magnetization arrangements are defined as "1" and "0" data, respectively, binary data can be written. The write method of this sequence will be referred to as "anti-parallel switching" hereinafter (C in FIG. 21).

In the above-described write method, the state of data of a selected cell changes sequentially from "1" to "0" to "1" to "0". In other words, by the write, the relative magnetization direction between the recording layer (ferromagnetic layer on the side facing the fixed layer side) and the fixed layer (ferromagnetic layer on the side facing the recording layer side when the fixed layer includes a plurality of ferromagnetic layers divided by nonmagnetic layers) of the MTJ element 10 changes from the parallel state to the anti-parallel state or from the anti-parallel state to the parallel state. Hence, before arbitrary data is written in a selected cell, the data of the cell must be read out. If the arbitrary data has already been written, no write is executed. If data different from the arbitrary data has been written, the write is executed to rewrite the data.

[2-2] Effect by Anti-Parallel Switching

In the above-described anti-parallel switching, in the magnetization reversal process, the magnetizations of the first and second ferromagnetic layers 15a and 15c become anti-parallel (FIG. 3(c)). Since the magnetizations of the first and second ferromagnetic layers 15a and 15c cancel each other, the magnetostatic energy does not increase. Hence, the reversal field can be made very small. However, to implement the anti-parallel switching, the magnetic field must be appropriately applied.

Normally, in random excitation by thermal energy or the like, the magnetizations of the ferro-coupled first and second ferromagnetic layers 15a and 15c respond in the parallel state. For this reason, the memory energy as the index of nonvolatility is an energy necessary for reversal while keeping the parallel state. In the magnetization reversal process in the parallel state, since a large magnetostatic energy is generated, the memory energy is very large. That is, according to the above-described anti-parallel switching, a large memory energy can be held, and a small reversal field can be provided.

This advantage of anti-parallel switching is known in the hard disk drive (HDD) field. Since only a write target part can be rewritten by moving the write head close to that part in an HDD, anti-parallel switching can be used without any device.

However, when anti-parallel switching is simply used in a magnetic random access memory, both a selected cell at the intersection between bit and word lines in the ON state and a semi-selected cell on only one wiring in the ON state execute the same magnetization process. For this reason, if the characteristic varies, it is difficult to avoid a problem such as a write error. Hence, anti-parallel switching has conventionally been regarded as inapplicable to a magnetic random access memory (D.C. Worledge et al, "Magnetic diagram of two identical coupled nanomagnets", Applied Physics Letters, Volume 85, No. 15, 12 Apr., 2004).

In the above-described write method according to the embodiment of the present invention, the reversal field of only the selected cell at the intersection between the first and second write wirings W1 and W2 in the ON state can be made small, and the decrease in reversal field of the semi-selected cell on one of the write wirings W1 and W2 can be suppressed. That is, the selected cell and semi-selected cell can have different magnetization processes. As a result, the reversal field of the recording layer 15 of the MTJ element 10 can be greatly reduced. The write current can be reduced, and additionally, write errors can be prevented.

Figure 4:
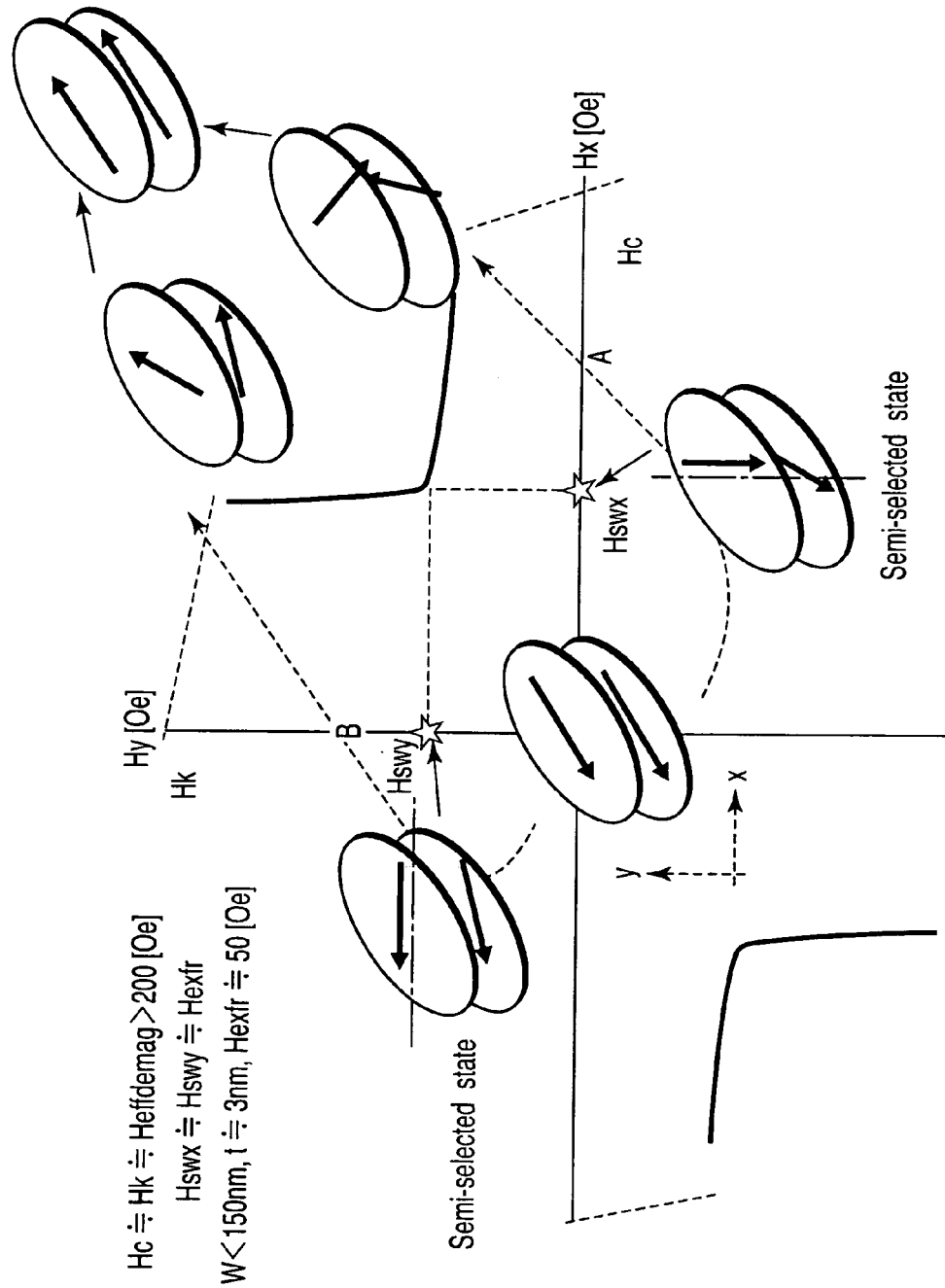
FIG. 4 is a view for explaining the mechanism of antiparallel switching according to the embodiment of the present invention.

The reversal field threshold curve (asteroid curve) has an ideal shape which approaches the origin near the write point, as shown in FIG. 4 to be described later. Hence, even when the actual threshold curve variously several percent, a sufficient write margin can be provided.

Further development has proved that the magnetizations of the ferro-coupled first and second ferromagnetic layers 15a and 15c in the semi-selected cell reverse while keeping the parallel state, and large energy is necessary for reversal by thermal excitation. The write method according to the embodiment of the present invention can also ensure sufficient nonvolatility of the semi-selected cell.

In all write schemes by a current magnetic field which are proposed so far, the write current value suddenly increases, and the write margin decreases due to micropatterning. To the contrary, in the write method according to the embodiment of the present invention, even when the MTJ element 10 is micropatterned, the magnetostatic energy rarely increases in the anti-parallel magnetization process. Hence, the reversal field does not suddenly increase. In the embodiment of the present invention, there is no factor to suddenly increase the basic write current value in micropatterning, and the write margin increases. Hence, high integration can be implemented.

The recording layer 15 of the MTJ element 10 includes two or more ferromagnetic layers. Since the volume of the recording layer 15 increases, and the memory energy can be increased, nonvolatility can be ensured even in micropatterning.

[2-3] Mechanism of Anti-Parallel Switching

FIG. 4 is a view for explaining the mechanism of anti-parallel switching according to the embodiment of the present invention. Details of the mechanism of anti-parallel switching will be described below.

As shown in FIG. 4, anti-parallel magnetization reversal can be implemented by applying magnetic fields equal to or higher than Hswx and Hswy. When magnetic fields lower than Hswx and Hswy or only one magnetic field is applied, only reversal in the parallel state occurs. Hence, the selected cell and semi-selected cell can have different magnetization processes, the selectively of the selected cell can be increased, and write errors can be prevented.

The reversal process of anti-parallel switching in the upper-right quadrant of the asteroid curve shown in FIG. 4 will be described below. When a magnetic field in the X-axis direction is applied first, and a magnetic field in the Y-axis direction is applied next, the reversal process is indicated by A in FIG. 4. When a magnetic field in the Y-axis direction is applied first, and a magnetic field in the X-axis direction is applied next, the reversal process is indicated by B in FIG. 4. The magnetic field in the X- or Y-axis direction is generated by the write currents I1 and I2 supplied to the first and second write wirings W1 and W2. In the example shown in FIG. 4, reversal occurs from the left-parallel magnetization arrangement to the right-parallel magnetization arrangement. For reversal from the right-parallel magnetization arrangement to the left-parallel magnetization arrangement, the write currents I1 and I2 in reverse directions are supplied in accordance with the same sequence.

The mechanism of anti-parallel switching will be described below in more detail on the basis of a detailed example.

In this example, assume a detailed asteroid curve for the MTJ element 10 having a short length of, e.g., about 150 nm. An NiFe alloy is used as the material of the first and second ferromagnetic layers 15a and 15c of the recording layer 15. The aspect ratio is 2 to 3. The thickness of a single layer of the recording layer 15 is about 3 nm. In this case, the ferro-coupled first and second ferromagnetic layers 15a and 15c satisfy $$Hc \approx Hk \approx Heffdemag \approx 400-600 \text{ [Oe]} \quad (1)$$

$$Hswx \approx Hswy \approx Hexfr \quad (2)$$

where Hc is the reversal field in the X-axis direction, Hk is the reversal field in the Y-axis direction, Hefffdemag is the effective demagnetizing field in the short direction, and Hexfr is the ferro-coupled field. Note that Hc≈Hk≈Heffdemag>200 [Oe] is preferable.

To obtain an ideal asteroid curve, the material and thickness of the nonmagnetic layer 15b of the recording layer 15 are set such that Hexfr≈50 [Oe] is almost satisfied. Hc and Hk are about four times Hswx and Hswy so that a very wide write margin can be provided. Even when the actual threshold curve varies several percent, a sufficient write margin can be provided.

When the MTJ element 10 is micropatterned, Heffdemag increases in inverse proportion to the short length of the MTJ element 10. On the other hand, Hexfr can be set independently. Assume that the Hexfr is set to, e.g., about 50 [Oe]. In this case, the write margin increases as the micropatterning progresses. In the anti-parallel magnetization process, the magnetostatic energy rarely increases, and the reversal field does not increase. Hence, the write current value to cause magnetization reversal does not increase, either. The memory energy for nonvolatility increases in proportion to Hc or Hk in FIG. 4 as the micropatterning progresses. Hence, there is no factor to increase the basic write current value in micropatterning, and high integration can be implemented.

[2-4] Write Method Example

Figure 5A:
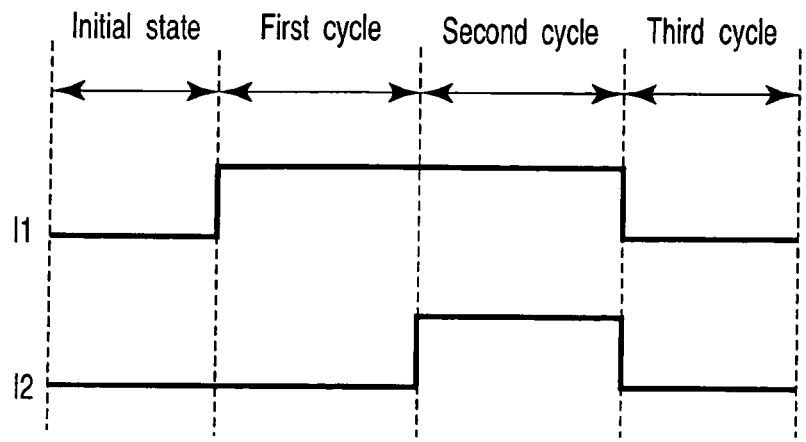
FIGS. 5A to 5C are graphs showing Write Method Examples 1 to 3 according to the embodiment of the present invention.
Figure 5B:
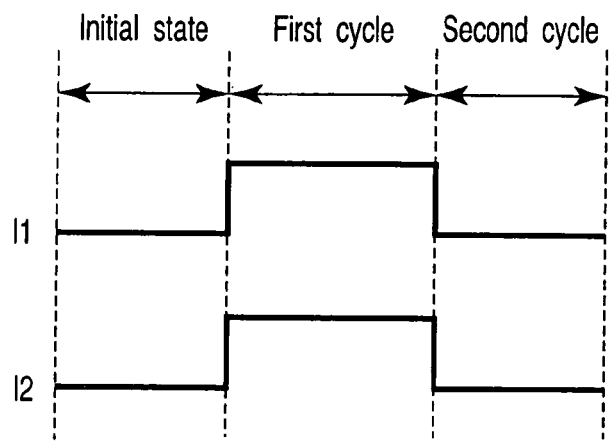
Figure 5C:
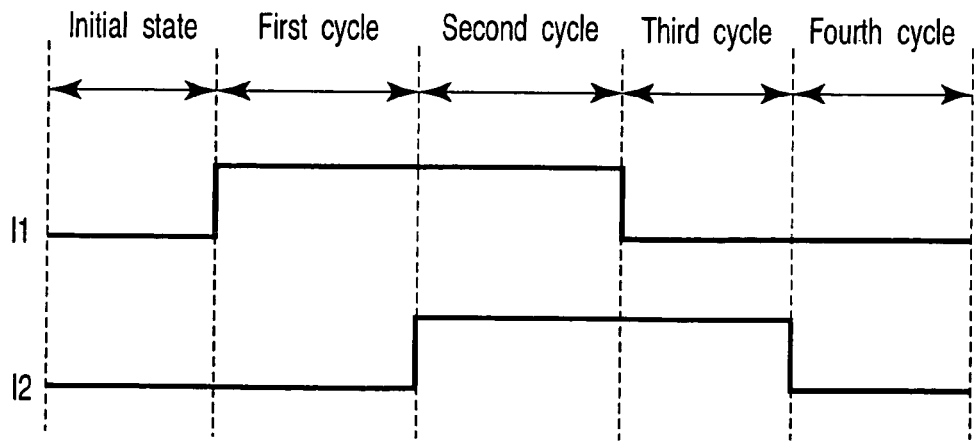

FIGS. 5A to 5C show Write Method Examples 1 to 3 according to the embodiment of the present invention. Write Method Examples 1 to 3 will be described below.

As shown in FIG. 5A, Write Method Example 1 is the same as the above-described write sequence shown in FIG. 3. More specifically, in the first cycle, the write current I1 is supplied to only the first write wiring W1 to obtain the scissors magnetization arrangement (FIG. 3(b)). In the second cycle, the write currents I1 and I2 are supplied to both the first and second write wirings W1 and W2 to set the anti-parallel magnetization arrangement (FIG. 3(c)). Finally, in the third cycle, supply of the write currents I1 and I2 to the first and second write wirings W1 and W2 is stopped.

As shown in FIG. 5B, in Write Method Example 2, the write wirings W1 and W2 are not turned on sequentially, unlike Write Method Example 1. More specifically, in the first cycle, both the first and second write wirings W1 and W2 are turned on simultaneously, and the write currents I1 and I2 are supplied to both wirings from the beginning. With this operation, the anti-parallel magnetization arrangement is set next to the scissors magnetization arrangement (FIGS. 3(b) and (c)). In the second cycle, supply of the write currents I1 and I2 to the first and second write wirings W1 and W2 is stopped. Even when both the write wirings W1 and W2 are simultaneously turned on, the same switching as in Write Method Example 1 can be implemented by appropriately setting both write current values.

As shown in FIG. 5C, in Write Method Example 3, the write wirings W1 and W2 are turned on sequentially and turned off sequentially, as in the so-called toggle write. More specifically, in the first cycle, the write current I1 is supplied to only the first write wiring W1. In the second cycle, the write currents I1 and I2 are supplied to both the first and second write wirings W1 and W2. In the third cycle, the first write wiring W1 turned on first is turned off, and supply of the write current I1 is stopped. In the fourth cycle, the second write wiring W2 turned on later is turned off, and supply of the write current I2 is stopped.

[3] Weak Ferro-Coupling

In the above-described write method, interlayer coupling between the first and second ferromagnetic layers 15a and 15c of the recording layer 15 is preferably relatively weak ferro-coupling such that anti-parallel magnetization reversal arrangement is obtained in the magnetization reversal process. Hence, the ferro-coupling constant C is preferably 0.0001 erg/cm$^2 \leq$ C $\leq$ 0.2 erg/cm$^2$. The reason for this is as follows. When the constant C was smaller than 0.0001 erg/cm$^2$, anti-parallel magnetization reversal was sometimes observed even in the semi-selected state. On the other hand, when the constant C exceeded 0.2 erg/cm$^2$, the angle between scissors magnetization arrangements in the semi-selected state was very small, and magnetization reversal in the parallel state was sometimes observed in the subsequent selected state. The thickness of, e.g., the nonmagnetic layer 15b is set such that the ferro-coupling constant C falls within the range.

[4] Means for Generating Different Anisotropy Magnetic Fields in Ferro-Coupled Ferromagnetic Layers FIG. 6 shows an example of the means for generating different anisotropy magnetic fields in the two ferro-coupled ferromagnetic layers of the recording layer according to the embodiment of the present invention. Three examples to generate different effective anisotropy magnetic fields Hk1 and Hk2 in the two ferro-coupled ferromagnetic layers will be described below.

(Case 1)

In Case 1, different anisotropy magnetic fields Hkint1 and Hkint2 are generated by the actual magnetic anisotropy of the two ferro-coupled ferromagnetic layers 15a and 15c. When the recording layer 15 made of, e.g., CoFe/Cu/NiFe is used, the anisotropy constants (induced magnetic anisotropy constants) of the ferromagnetic layers 15a and 15c are set to $1 \times 10^5$ dyn/cm$^3$ and $1 \times 10^4$ dyn/cm$^3$. The anisotropy magnetic fields of the ferromagnetic layers 15a and 15c are set to Hkint1$\approx$20 [Oe] and Hkint2$\approx$5 [Oe].

(Case 2)

In Case 2, different saturation magnetization constants M1 and M2 are set for the two ferro-coupled ferromagnetic layers 15a and 15c. The recording layer 15 made of, e.g., Ni60Fe40/Cu/Ni80Fe20 (the number indicates the atomic percentage [%]) is used. The short length of the MTJ element 10 is set to about 140 nm. Thicknesses t1 and t2 of the ferromagnetic layers 15a and 15c are set to about 2 nm. In this case, the saturation magnetization constants of the ferromagnetic layers 15a and 15c are set to $4\pi$M1$\approx$14000 gauss and $4\pi$M2$\approx$9500 gauss. The anisotropy magnetic fields Hk1 and Hk2 of the ferromagnetic layers 15a and 15c are set to 100 to 200 [Oe] and 50 to 100 [Oe].

(Case 3)

In Case 3, different thicknesses t1 and t2 are set for the two ferro-coupled ferromagnetic layers 15a and 15c. The recording layer 15 made of, e.g., NiFe/Cu/NiFe is used. The short length of the MTJ element 10 is set to about 140 nm. The saturation magnetizations ($4\pi$M1 and $4\pi$M2) of the ferromagnetic layers 15a and 15c are set to about 9,500 gauss. In this case, the thicknesses of the ferromagnetic layers 15a and 15c are set to t1$\approx$3 nm and t2$\approx$1.5 nm. The anisotropy magnetic fields Hk1 and Hk2 of the ferromagnetic layers 15a and 15c are set to 100 to 200 [Oe] and 50 to 100 [Oe]. The thicknesses t1 and t2 of the two ferro-coupled ferromagnetic layers 15a and 15c are preferably different by about twice.

According to Cases 1 to 3 described above, the ferromagnetic layers 15a and 15c can have the different effective anisotropy magnetic fields Hk1 and Hk2. For this reason, when appropriate write current values are set, scissors magnetization arrangements which sandwich the X-axis can be obtained, as shown in FIG. 6, by applying a magnetic field to one write wiring.

The different anisotropy magnetic fields Hk1 and Hk2 may be generated by using different materials or different shapes for the ferromagnetic layers 15a and 15c.

[5] Oblique Arrangement of MTJ Element

[5-1] Angle of Oblique Arrangement

FIG. 7 is a view for explaining an angle $\theta$ of oblique arrangement of the MTJ element according to the embodiment of the present invention. The angle of oblique arrangement of the MTJ element will be described below.

As shown in FIG. 7, when the applied magnetic field is zero, the direction of axis of easy magnetization of the MTJ element 10 is oblique with respect to the running directions (X-axis direction and Y-axis direction) of the first and second write wirings W1 and W2. The angle made by the direction of axis of easy magnetization of the MTJ element 10 and the running direction (X-axis direction) of the first write wiring W1 is defined as $\theta$. Examples of the angle $\theta$ will be described below. The angle $\theta$ may be the angle made by the direction of axis of easy magnetization of the MTJ element 10 and the running direction (Y-axis direction) of the second write wiring W2.

(First Angle Example)

In the first angle example, 0°<$\theta$$\leq$30° is set to further reduce the write current value.

Figure 8A:
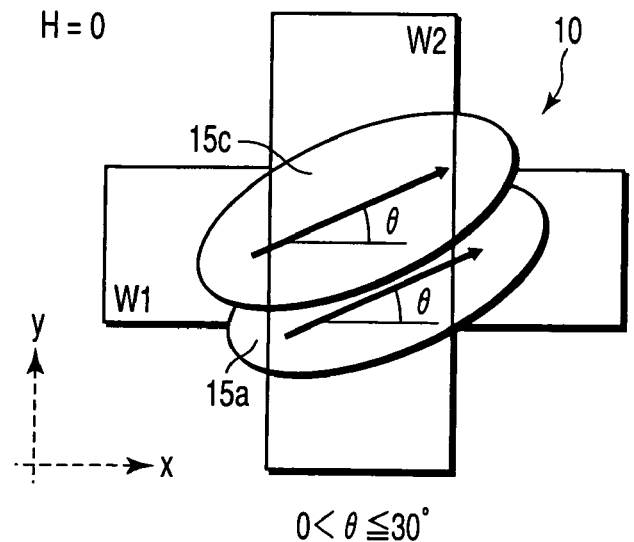
FIGS. 8A and 8B are views for explaining the effect of the first angle example of oblique arrangement of the MTJ element according to the embodiment of the present invention.
Figure 8B:
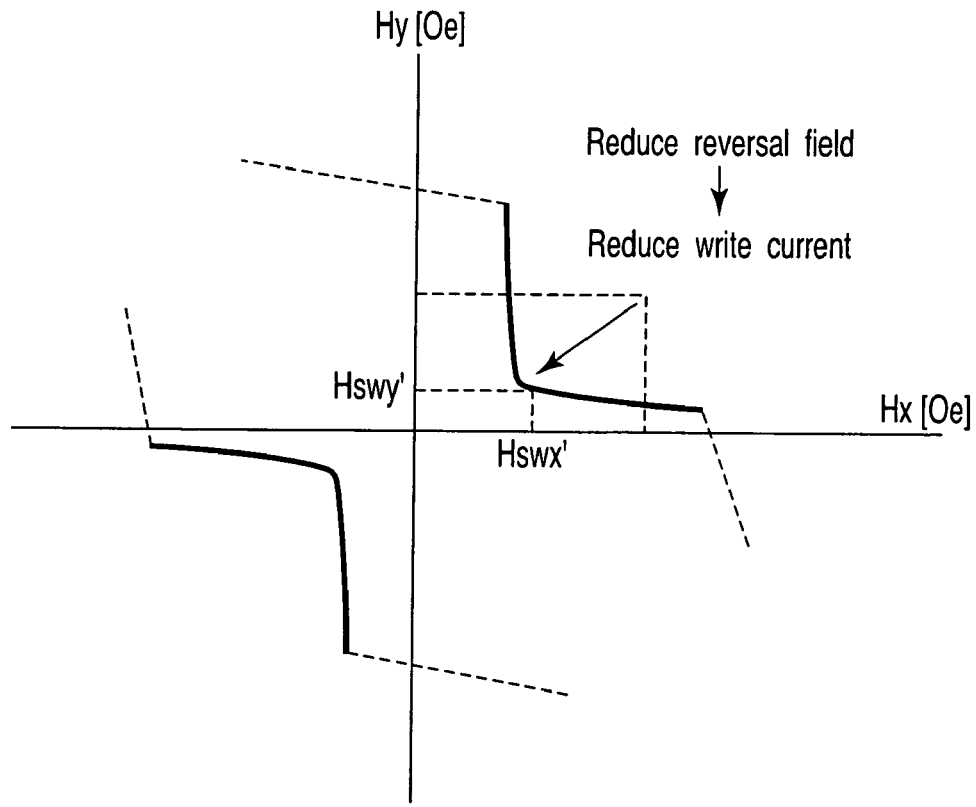

FIGS. 8A and 8B are views for explaining the effect of the first angle example of oblique arrangement of the MTJ element according to the embodiment of the present invention.

As shown in FIG. 8A, in the first angle example, the angle $\theta$ made by the direction of axis of easy magnetization of the MTJ element 10 and the running direction (X-axis direction) of the first write wiring W1 falls within the range of 0° (exclusive) to 30° (inclusive) (0°<$\theta$$\leq$30°). The reason why $\theta$$\leq$30° is that if $\theta$>30°, the write driver considerably becomes large, and the cost increases.

In this case, as shown in FIG. 8B, the write current value (Hswx' or Hswy' on the magnetic field basis) of the write wiring turned on first can be halved. In addition, the write current value (Hswy' or Hswx' on the magnetic field basis) of the other write wiring turned on next can also be halved. For example, when $\theta$$\leq$30°, the practical write current value can be set to 7 mA. This structure can also cope with a variation in magnetic characteristic. Cells which cannot be write-accessed can be eliminated at the angle $\theta$ of 30°.

(Second Angle Example)

In the second angle example, 5°$\leq$$\theta$$\leq$30° is set to optimize the write margin for a variation in asteroid curve.

Figure 9A:
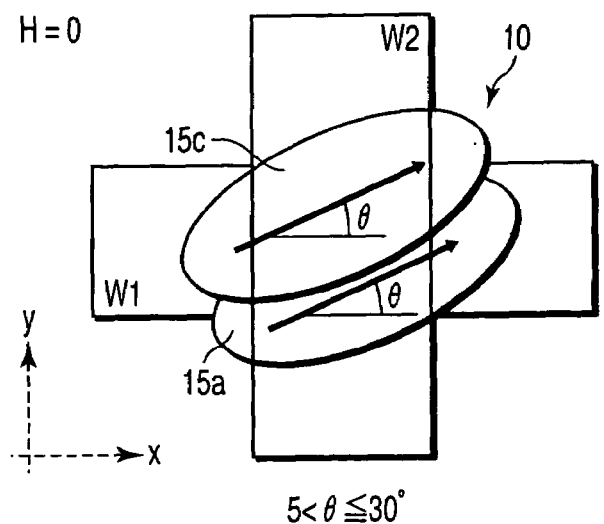
FIGS. 9A and 9B are views for explaining the effect of the second angle example of oblique arrangement of the MTJ element according to the embodiment of the present invention.
Figure 9B:
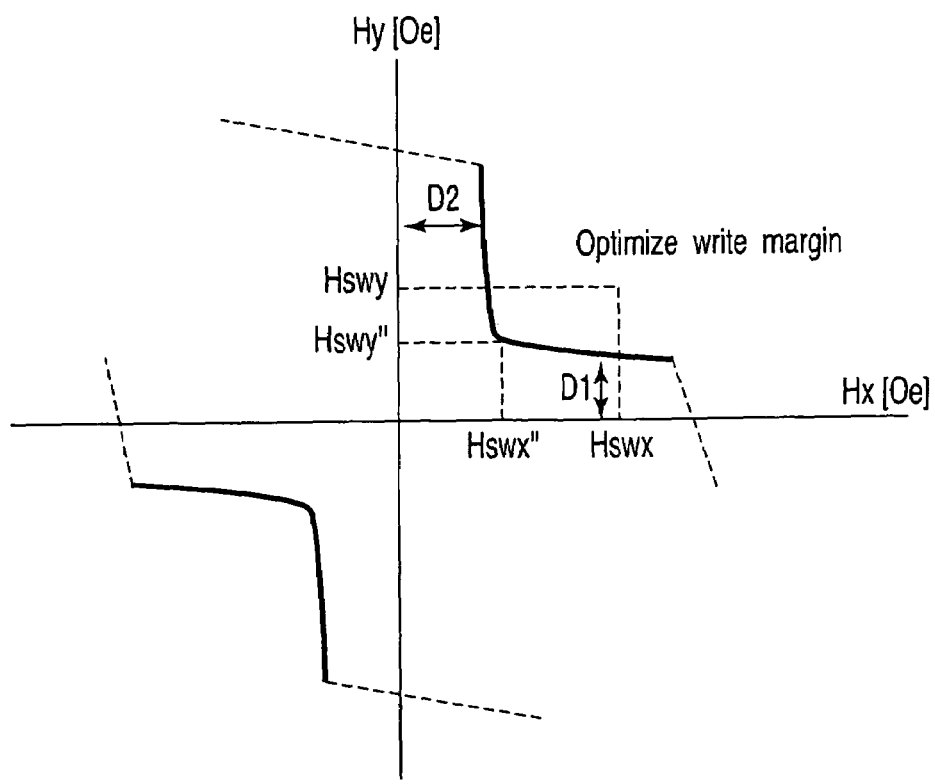

FIGS. 9A and 9B are views for explaining the effect of the second angle example of oblique arrangement of the MTJ element according to the embodiment of the present invention.

As shown in FIG. 9A, in the second angle example, the angle $\theta$ made by the direction of axis of easy magnetization of the MTJ element 10 and the running direction (X-axis direction) of the first write wiring W1 falls within the range of 5° (inclusive) to 30° (inclusive) (5°$\leq$$\theta$$\leq$30°). The reason why $\theta$$\geq$5° is that if $\theta$<5°, anti-parallel magnetization reversal was sometimes observed in the semi-selected state (semi-selected state in which only Hx is applied in FIG. 9A).

In this case, as shown in FIG. 9B, the structure can cope with a typical variation of about 3% in asteroid curve, and the write margin can be ensured. On the magnetic field basis, the reversal fields are Hswx" and Hswy". The asteroid curve can be spaced apart from the X- and Y-axes by appropriate distances D1 and D2.

(Third Angle Example)

In the third angle example, $\theta \leq 10°$ is set to implement an ideal asteroid curve. When $\theta \leq 10°$, the write current value can be made as small as about 3 mA, and the asteroid curve can be located almost at the center of the upper-right quadrant.

Figure 10A:
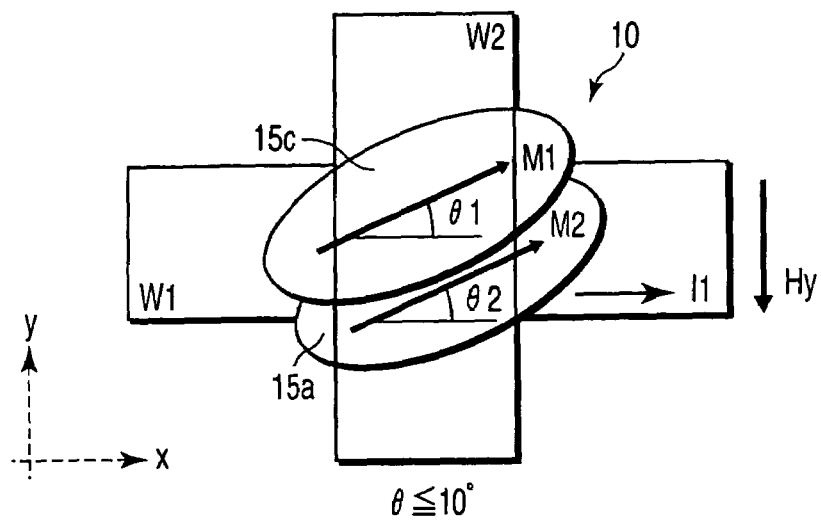
FIGS. 10A and 10B are views for explaining the effect of the third angle example of oblique arrangement of the MTJ element according to the embodiment of the present invention.
Figure 10B:
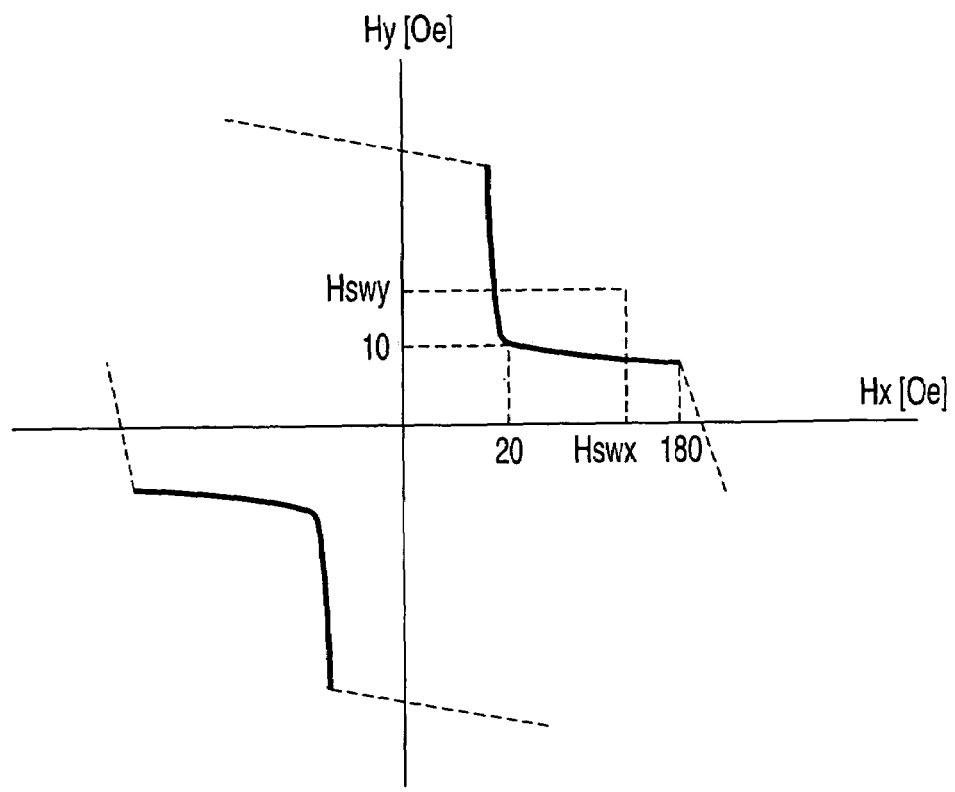
Figure 11:
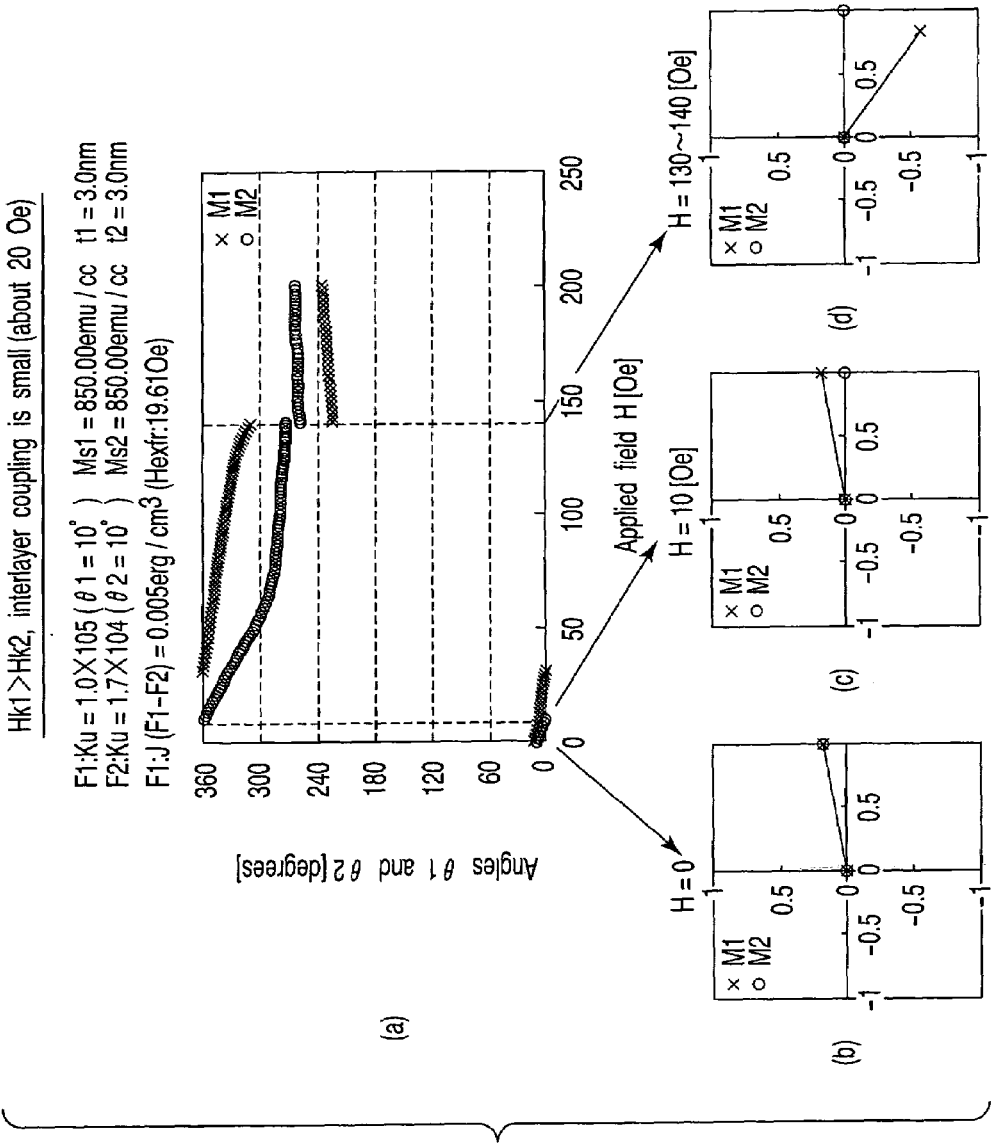
FIG. 11 is view showing the relationship between the angle and the applied field in the write operation in the third angle example shown in FIGS. 10A and 10B.

FIGS. 10A and 10B are views for explaining the third angle example of oblique arrangement of the MTJ element according to the embodiment of the present invention. FIG. 11 shows the relationship between the angle and the applied field in the write operation in the third angle example shown in FIGS. 10A and 10B.

As shown in FIG. 10A, in the third angle example, the angle $\theta$ made by the direction of axis of easy magnetization of the MTJ element 10 and the running direction (X-axis direction) of the first write wiring W1 is 10° or less ($\theta \leq 10°$). The lower limit value of the angle $\theta$ in the third angle example can be either $0 < \theta$ or $5 \geq \theta$.

The write operation in the third example will be described below. The effective anisotropy constants of the recording layer 15 are $1 \times 10^5$ dyn/cm$^3$ and $1.7 \times 10^4$ dyn/cm$^3$ (Hkint1≈100 [Oe] and Hkint2≈17 [Oe] on the anisotropy magnetic field basis), $4\pi M1 \approx 4\pi M2 \approx 10700$ gauss, $t1 \approx t2 \approx 3$ nm, and $\theta1 \approx \theta2 \approx 10°$.

First, the write current I1 is supplied to only the first write wiring W1 of the first and second write wirings W1 and W2, and the magnetic field Hy is applied in the negative direction of the Y-axis. FIG. 11(a) shows the response of the recording layer 15 at this time.

As shown in FIG. 11(a), $\theta1=\theta2=10°$ without magnetic field application (FIG. 11(b)). As the magnetic field is applied, a magnetization arrangement similar to the scissors magnetization arrangement is obtained. When a magnetic field of 10 [Oe] is applied, the magnetization arrangement starts changing to scissors magnetization arrangements which sandwich the X-axis (FIG. 11(c)). This state can be maintained up to a magnetic field of 130 to 140 [Oe] (FIG. 11(d)). When the magnetic field Hx is applied in the negative X direction in this state, magnetization reversal occurs at about 20 [Oe]. The asteroid curve at this time has an ideal shape as shown in FIG. 10B.

[5-2] Means for Oblique Arrangement

Figure 12A:
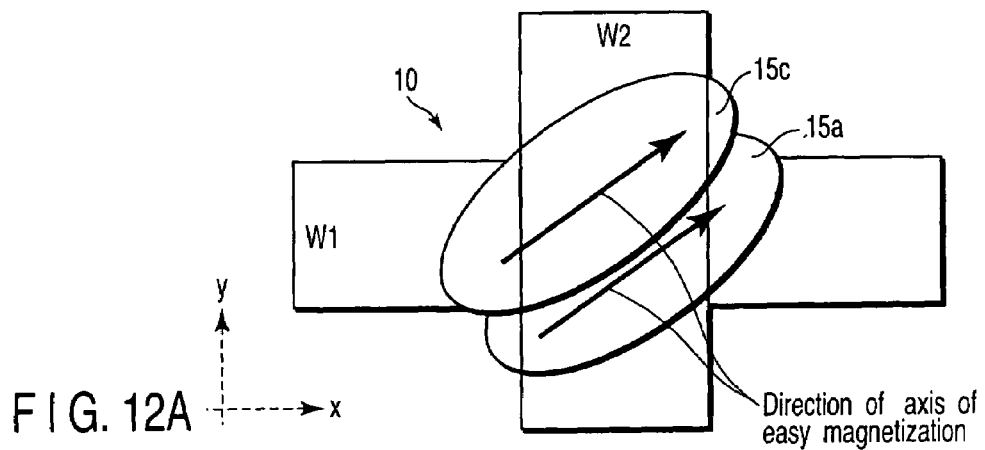
FIGS. 12A to 12C are views showing means for oblique arrangement of the MTJ element according to the embodiment of the present invention.
Figure 12B:
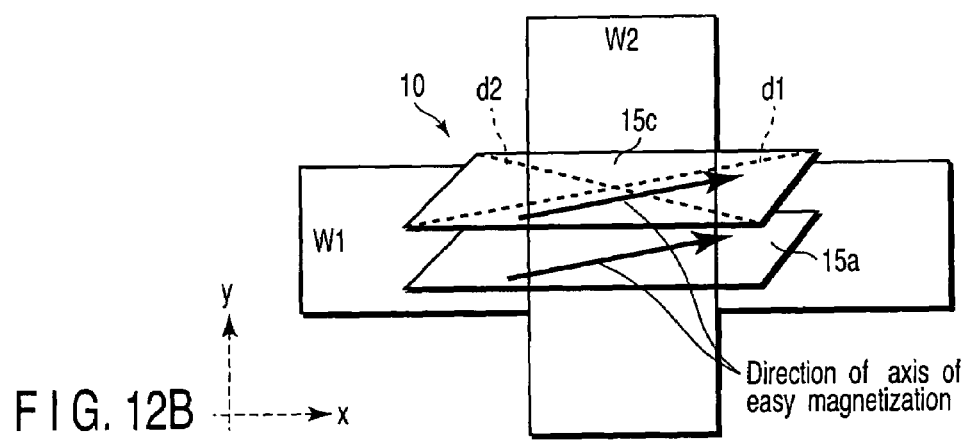
Figure 12C:
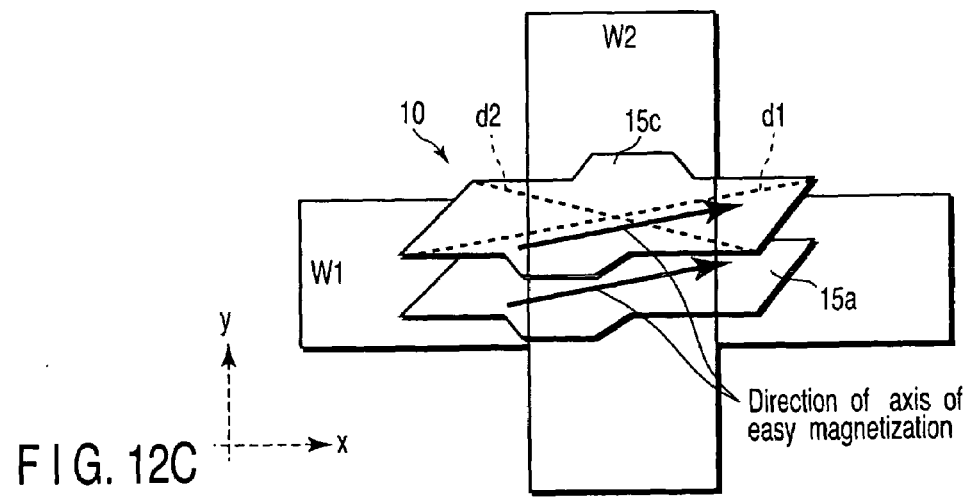

FIGS. 12A to 12C show means for oblique arrangement of the MTJ element according to the embodiment of the present invention. The means for obliquely arranging the MTJ element will be described below.

As shown in FIGS. 12A to 12C, the first write wiring W1 runs in the X-axis direction. The second write wiring W2 runs in the Y-axis direction. The MTJ element 10 is arranged at the intersection between the first and second write wirings W1 and W2 between them. The direction of axis of easy magnetization of the MTJ element 10 is oblique with respect to the running directions (X-axis direction and Y-axis direction) of the first and second write wirings W1 and W2.

In the example shown in FIG. 12A, the MTJ element 10 itself is arranged obliquely. More specifically, the longitudinal side as the direction of axis of easy magnetization of the MTJ element 10 is arranged obliquely with respect to the running directions (X-axis direction and Y-axis direction) of the first and second write wirings W1 and W2.

In the example shown in FIG. 12B, the axis of easy magnetization is given in the oblique direction by using the shape anisotropy of the MTJ element 10. More specifically, the planar shape of the MTJ element 10 is formed into a parallelogram in which one diagonal d1 is longer than the other diagonal d2, thereby giving the axis of easy magnetization in the direction of the long diagonal d1. With this arrangement, the axis of easy magnetization of the MTJ element 10 can be arranged obliquely, as in FIG. 12A.

In the example shown in FIG. 12C, the axis of easy magnetization is given in the oblique direction by using the shape anisotropy of the MTJ element 10, as in FIG. 12B. In this example, the MTJ element also has projecting portions which project from sides of a parallelogram. That is, the MTJ element has a so-called cross shape.

[6] Example of Layered Structure of Recording Layer of MTJ Element

Figure 13:
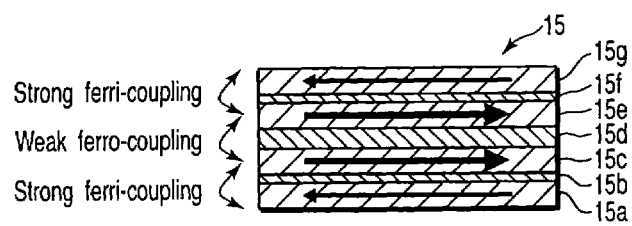
FIG. 13 is a view showing an example of the layered structure of the recording layer of the MTJ element according to the embodiment of the present invention.

FIG. 13 shows an example of the layered structure of the recording layer of the MTJ element according to the embodiment of the present invention. The example of the layered structure of the recording layer of the MTJ element will be described below.

As shown in FIG. 13, the recording layer 15 of the MTJ element 10 includes the first ferromagnetic layer 15a/first nonmagnetic layer 15b/second ferromagnetic layer 15c/second nonmagnetic layer 15d/third ferromagnetic layer 15e/third nonmagnetic layer 15f/fourth ferromagnetic layer 15g. That is, the recording layer 15 of this example has the four ferromagnetic layers 15a, 15c, 15e, and 15g. The layers of the recording layer 15 are made of, e.g., NiFe/Ru/NiFe/Cu/NiFe/Ru/NiFe.

The first and second ferromagnetic layers 15a and 15c have strong ferri-coupling. The second and third ferromagnetic layers 15c and 15e have weak ferro-coupling. The third and fourth ferromagnetic layers 15e and 15g have strong ferri-coupling. In weak ferro-coupling, the ferro-coupling constant is, e.g., about 0.0001 to 0.2 erg/cm$^2$. In strong ferri-coupling, the ferri-coupling constant is, e.g., about 0.4 erg/cm$^2$ or more.

When the recording layer 15 of the MTJ element 10 has a layered structure, as described above, the volume of the recording layer 15 increases, and the memory energy of the recording layer 15 can further be increased. Hence, more advanced micropatterning is possible.

[7] Example of Layered Structure of Magnetization Fixed Layer of MTJ Element

Figure 14:
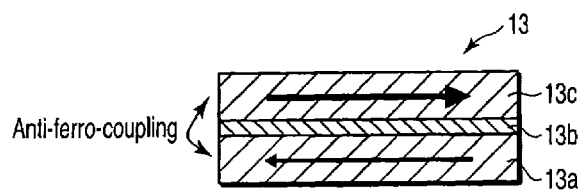
FIG. 14 is a view showing an example of the layered structure example of the magnetization fixed layer of the MTJ element according to the embodiment of the present invention.
Figure 15A:
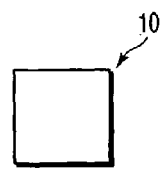
FIGS. 15A to 15I are views showing examples of the planar shape of the MTJ element according to the embodiment of the present invention.
Figure 15B:
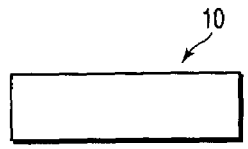
Figure 15C:
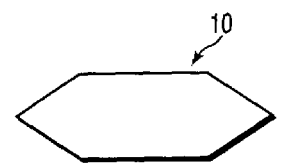
Figure 15D:
Figure 15E:
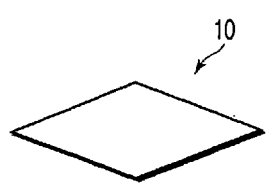
Figure 15F:
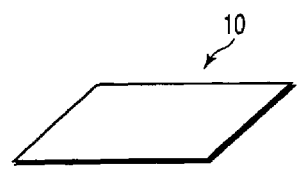
Figure 15G:
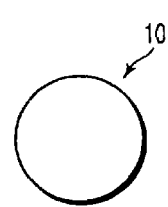
Figure 15H:
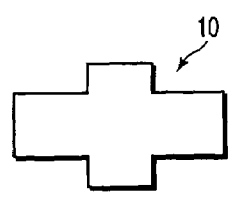
Figure 15I:
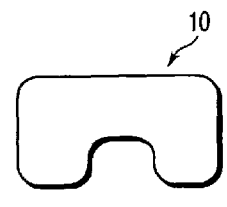

FIG. 14 shows an example of the layered structure example of the magnetization fixed layer of the MTJ element according to the embodiment of the present invention. The example of the layered structure of the magnetization fixed layer of the MTJ element will be described below.

The magnetization fixed layer 13 can be formed from either a single layer as shown in FIG. 2 or a plurality of layers. For example, as shown in FIG. 14, the magnetization fixed layer 13 may include a first ferromagnetic layer 13a, second ferromagnetic layer 13c, and nonmagnetic layer 13b sandwiched between the first and second ferromagnetic layers 13a and 13c. The first and second ferromagnetic layers 13a and 13c have anti-ferromagnetic coupling through the nonmagnetic layer 13b. Hence, when the applied field is zero, the magnetization directions of the first and second ferromagnetic layers 13a and 13c are almost antiparallel. The fixed layer 13 may have the synthetic structure in which the anti-parallel magnetization arrangement is obtained when the applied field is zero. The first and second ferromagnetic layers 13a and 13c may have ferromagnetic coupling.

[8] Planar Shape of MTJ Element

FIGS. 15A to 15I show examples of the planar shape of the MTJ element according to the embodiment of the present invention. The examples of the planar shape of the MTJ element will be described below.

As shown in FIGS. 15A to 15I, the planar shape of the MTJ element 10 can variously be changed to a square, rectangle, hexagon, ellipse, rhombus, parallelogram, circle, cross, or beans-shape (concave shape). The corners of the illustrated shapes may be round.

[9] Sectional Shape of MTJ Element

Figure 16A:
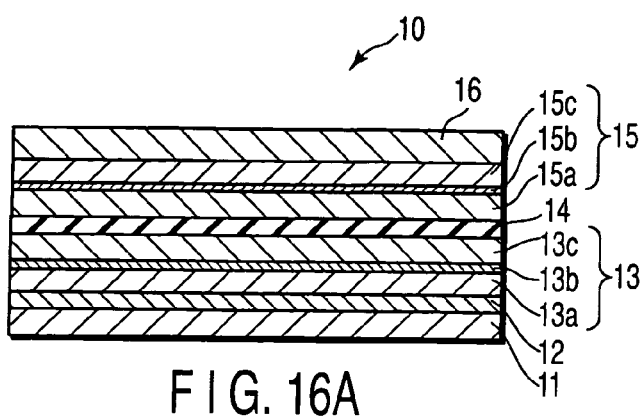
FIGS. 16A to 16C are views showing examples of the sectional shape of the MTJ element according to the embodiment of the present invention.
Figure 16B:
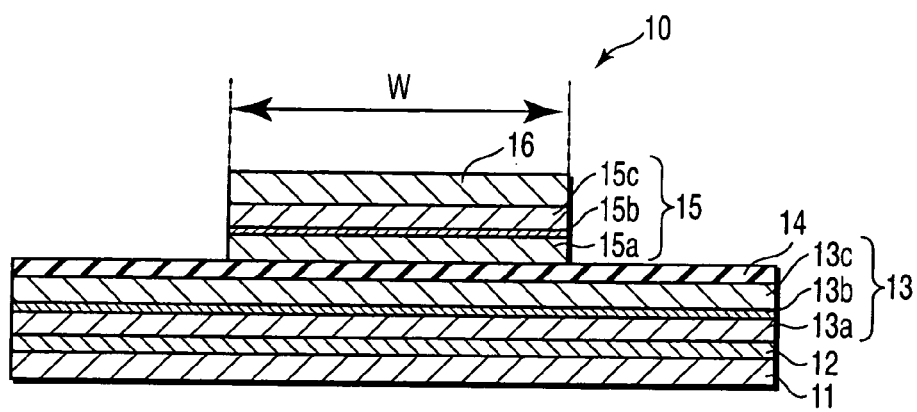
Figure 16C:
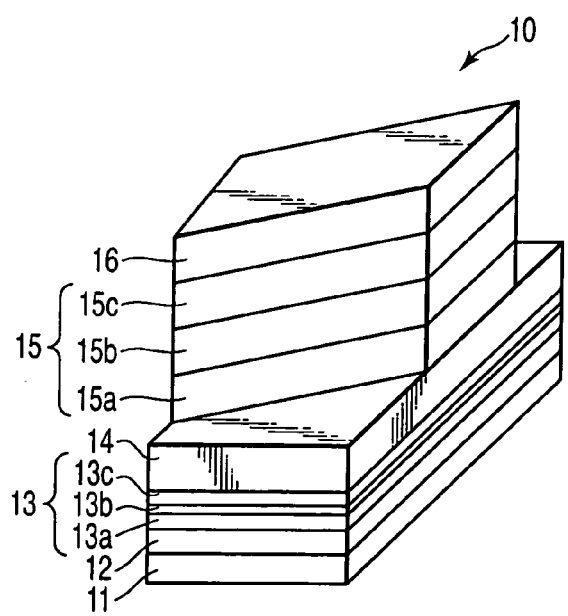

FIGS. 16A to 16C show examples of the sectional shape of the MTJ element according to the embodiment of the present invention. The examples of the sectional shape of the MTJ element will be described below.

As shown in FIG. 16A, all layers of the MTJ element 10 may be processed simultaneously to make the side surfaces of all layers match each other.

As shown in FIG. 16B, the size of the recording layer 15 and cap layer 16 parallel to the film surface may be smaller than that of the seed electrode layer 11, magnetization fixation layer 12, magnetization fixed layer 13, and tunnel barrier layer 14 so that the MTJ element 10 may have a convex sectional shape. The width of the recording layer 15 and cap layer 16 is processed to W. The width W is the above-described short length of the MTJ element 10. The long sides of the MTJ element 10 extend to the far side of the drawing surface. The longitudinal length of the MTJ element 10 is about 2 to 3 times the width W.

As shown in FIG. 16C, the seed electrode layer 11, magnetization fixation layer 12, magnetization fixed layer 13, and tunnel barrier layer 14 may be a rectangle, and the recording layer 15 and cap layer 16 may be a parallelogram, as shown in FIG. 12B, to give the axis of easy magnetization in the oblique direction. ps [10] Material The MTJ element 10 includes the seed electrode layer 11, the magnetization fixation layer 12, the magnetization fixed layer 13 including the first ferromagnetic layer 13a/nonmagnetic layer 13b/second ferromagnetic layer 13c, the tunnel barrier layer 14, the recording layer 15 including the first ferromagnetic layer 15a/nonmagnetic layer 15b/second ferromagnetic layer 15c, and the cap layer 16. The layers of the MTJ element 10 and the write wirings W1 and W2 are made of the following materials.

Examples of the materials of the first ferromagnetic layer 15a/nonmagnetic layer 15b/second ferromagnetic layer 15c of the recording layer 15 are NiFe/Ru/NiFe, CoFe/Ru/CoFe, CoFe/Cu/NiFe, NiFe/Cu/NiFe, CoFe/Cu/CoFe, and CoFe/Cu/NiFe.

As the material of the cap layer 16, a conductive material such as TaN which causes no interdiffusion to the recording layer 15 is preferably used.

For the tunnel barrier layer 14, various dielectric materials such as $AlO_x$ (e.g., $Al_2O_3$), $MgO_x$, $SiO_2$, AlN, $Bi_2O_3$, $MgF_2$, $CaF_2$, $SrTiO_2$, and $AlLaO_3$ can be used. These dielectric materials may contain oxygen, nitrogen, or fluorine defects. The layer 14 need not always be a tunnel barrier and can also be a magnetoresistive layer made of a conductive metal, a semimetal, or a semiconductor which exhibits the magnetoresistive effect.

An example of the materials of the first ferromagnetic layer 13a/nonmagnetic layer 13b/second ferromagnetic layer 13c of the magnetization fixed layer 13 is CoFe/Ru/CoFe.

Examples of the material of the magnetization fixation layer 12 are PtMn and IrMn.

For the seed electrode layer 11, Ta, NiFeCr, or a layered film thereof is used to promote reduction of the resistance value and crystal growth of the magnetization fixation layer.

For the first and second write wirings W1 and W2, Cu or Al coated with a magnetic material is used. For an embedded memory, when the write wirings W1 and W2 having no magnetic material coating are used, and the utilization of the current reduction effect by this embodiment is maximized, the number of steps can largely be decreased.

The following materials can also be used for the ferromagnetic layers 13a, 13c, 15a, and 15c of the magnetization fixed layer 13 and recording layer 15. For example, Fe, Co, Ni, a layered film thereof, an alloy thereof, magnetite having a high spin polarizability, an oxide such as $CrO_2$ or $RXMnO_{3-y}$ (R: rare earth, X: Ca, Ba, or Sr), or a Heusler alloy such as NiMnSb or PtMnSb is preferably used. The magnetic materials may contain a small amount of nonmagnetic element such as Ag, Cu, Au, Al, Mg, Si, Bi, Ta, B, C, O, N, Pd, Pt, Zr, Ir, W, Mo, or Nb as long as the ferromagnetism is not lost.

[11] Magnetic Random Access Memory

A select transistor cell, select diode cell, and cross-point cell of the magnetic random access memory using the cell shown in FIG. 1 will be described below.

[11-1] Select Transistor

Figure 17A:
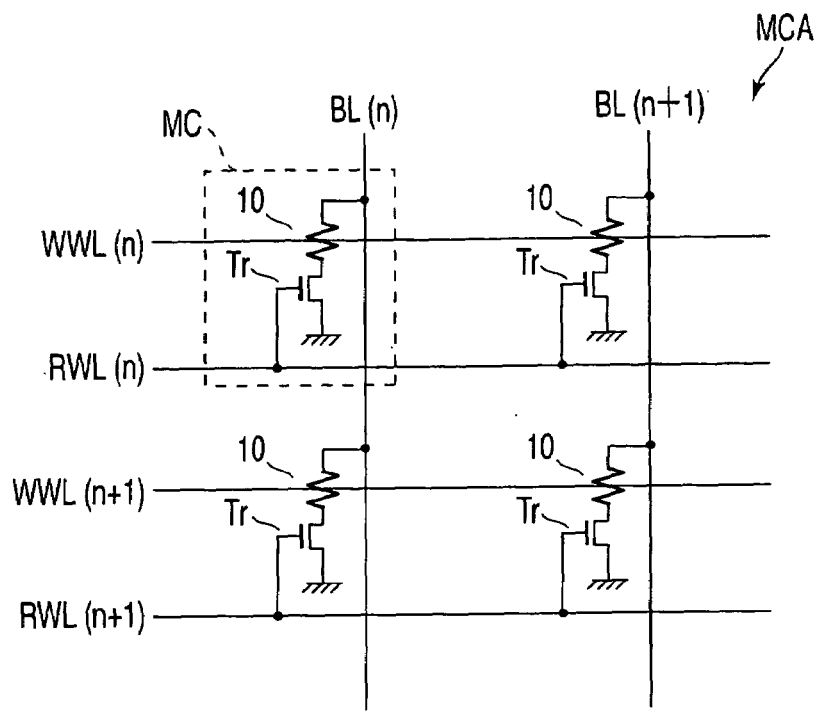
FIGS. 17A and 17B are views showing select transistor memory cells of the magnetic random access memory according to the embodiment of the present invention.
Figure 17B:
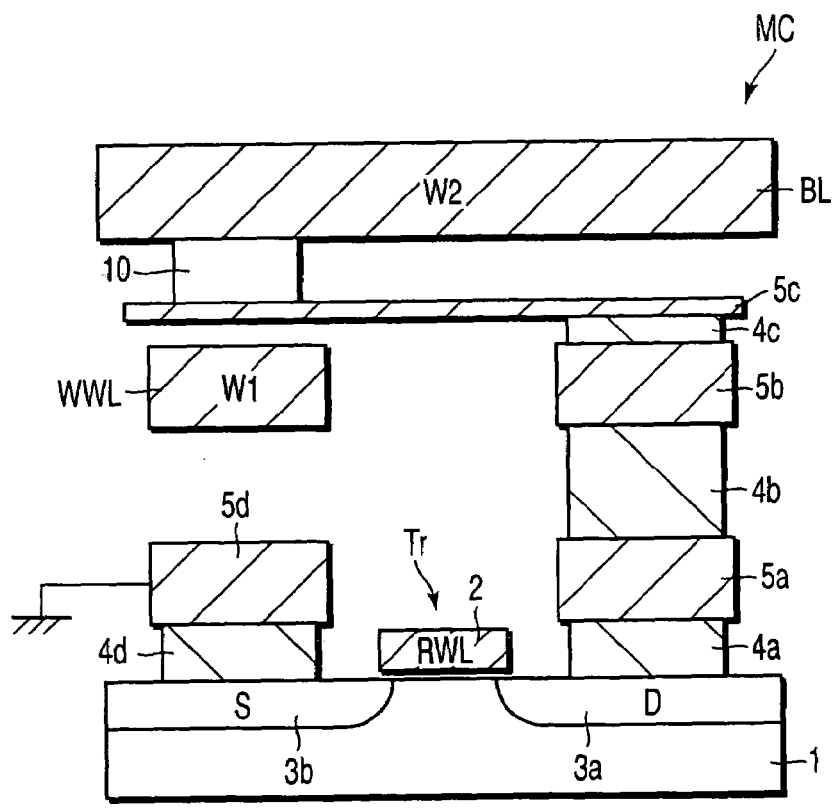

FIGS. 17A and 17B show select transistor memory cells of the magnetic random access memory according to the embodiment of the present invention. The select transistor cell structure will be described below.

As shown in FIGS. 17A and 17B, one cell MC having a select transistor structure includes one MTJ element 10, a transistor (e.g., a MOS transistor) Tr connected to the MTJ element 10, a write word line (first write wiring W1) WWL, and a bit line (second write wiring W2) BL. The MTJ element 10 comprises the recording layer 15 including the ferromagnetic layers 15a and 15c with weak ferro-coupling. The axis of easy magnetization is oblique with respect to the running directions of the write word line WWL and bit line BL. A memory cell array MCA is formed by laying out a plurality of memory cells MC in an array.

More specifically, one terminal of the MTJ element 10 is connected to one end (drain diffusion layer) 3a of the current path of the transistor Tr through a base metal layer 5c, contacts 4a, 4b, and 4c, and wirings 5a and 5b. The other terminal of the MTJ element 10 is connected to the bit line BL. The write word line WWL electrically disconnected from the MTJ element 10 is provided under the MTJ element 10. The other end (source diffusion layer) 3b of the current path of the transistor Tr is connected to, e.g., ground through a contact 4d and wiring 5d. A gate electrode 2 of the transistor Tr functions as a read word line RWL.

In the select transistor memory cell, the data write and read are executed in the following way.

In the write operation, the above-described anti-parallel switching is executed. The write current I1 is supplied to the write word line WWL corresponding to a selected one of the plurality of MTJ elements 10. The magnetic field generated by the write current I1 is applied to the MTJ element 10. The magnetizations of the ferromagnetic layers 15a and 15c of the recording layer 15 of the MTJ element 10 change to the scissors magnetization arrangement (FIG. 3(b)). The write current I2 is supplied to the bit line BL corresponding to the selected MTJ element 10. The synthetic field of the magnetic fields generated by the write currents I1 and I2 is applied to the MTJ element 10. As a result, the magnetizations of the ferromagnetic layers 15a and 15c of the recording layer 15 of the MTJ element 10 change to the anti-parallel magnetization arrangement (FIG. 3(c)). When supply of the write currents I1 and I2 is stopped, the magnetization of the recording layer 15 is reversed to that before the write. When the state in which the magnetization directions of the magnetization fixed layer 13 and recording layer 15 are parallel is defined as a "1" state, and the anti-parallel state is defined as a "0" state, a binary data write is implemented.

The read operation is executed in the following way by using the transistor Tr which functions as a read switching element. The bit line BL and read word line RWL corresponding to the selected MTJ element 10 are selected. A read current Ir is supplied in the direction perpendicular to the film surface of the MTJ element 10. When the magnetization of the magnetization fixed layer 13 (magnetization of the ferromagnetic layer closest to the recording layer 15 when the magnetization fixed layer 13 has a multilayered structure) and the magnetization of the recording layer 15 are almost parallel (e.g., the "1" state), the resistance is low. When the magnetizations are almost anti-parallel (e.g., the "0" state), the resistance is high. The resistance due to the tunneling magnetoresistive (TMR) effect is measured and compared with the resistance value of a reference cell which is independently provided, thereby determining the "1" or "0" state of the MTJ element 10.

[11-2] Select Diode

Figure 18A:
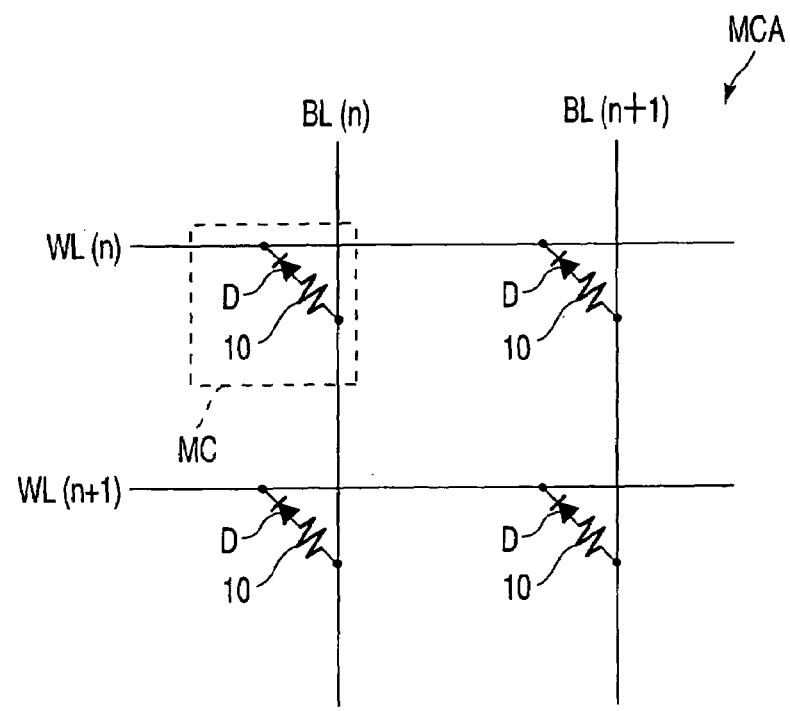
FIGS. 18A and 18B are views showing select diode memory cells of the magnetic random access memory according to the embodiment of the present invention.
Figure 18B:
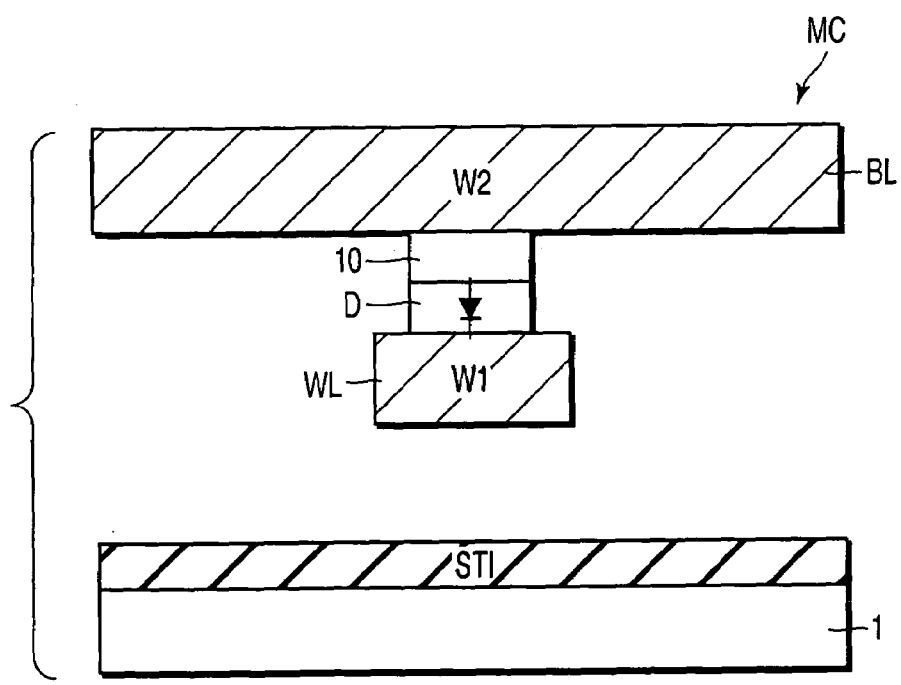

FIGS. 18A and 18B show a select diode memory cell of the magnetic random access memory according to the embodiment of the present invention. The select diode cell structure will be described below.

As shown in FIGS. 18A and 18B, one cell MC having a select diode structure includes one MTJ element 10, a diode D connected to the MTJ element 10, the bit line BL, and a word line WL. The MTJ element 10 comprises the recording layer 15 including the ferromagnetic layers 15a and 15c with weak ferro-coupling. The axis of easy magnetization is oblique with respect to the running directions of the word line WL and bit line BL. The memory cell array MCA is formed by laying out a plurality of memory cells MC in an array.

The diode D is, e.g., a p-n junction diode including a p-type semiconductor layer and n-type semiconductor layer. One terminal (e.g., the p-type semiconductor layer) of the diode D is connected to the MTJ element 10. The other terminal (e.g., the n-type semiconductor layer) of the diode D is connected to the word line WL. In the structure shown in FIGS. 18A and 18B, a current flows from the bit line BL to the word line WL.

The location or direction of the diode D can be changed variously. For example, the diode D may be arranged in a direction to supply a current from the word line WL to the bit line BL. The diode D may be formed in a semiconductor substrate 1. The diode D may be a Schottky barrier diode including a semiconductor layer and metal layer.

The data write operation of the select diode memory cell is the same as that of the select transistor cell. Anti-parallel switching is executed.

The data read operation is also almost the same as that of the select transistor cell. In the select diode cell, the diode D is used as a read switching element. More specifically, the biases of the bit line BL and word line WL are controlled by using the rectifying effect of the diode D such that an unselected MTJ element has a reverse bias. Accordingly, the read current Ir is supplied to only the selected MTJ element 10.

[11-3] Cross-Point

Figure 19A:
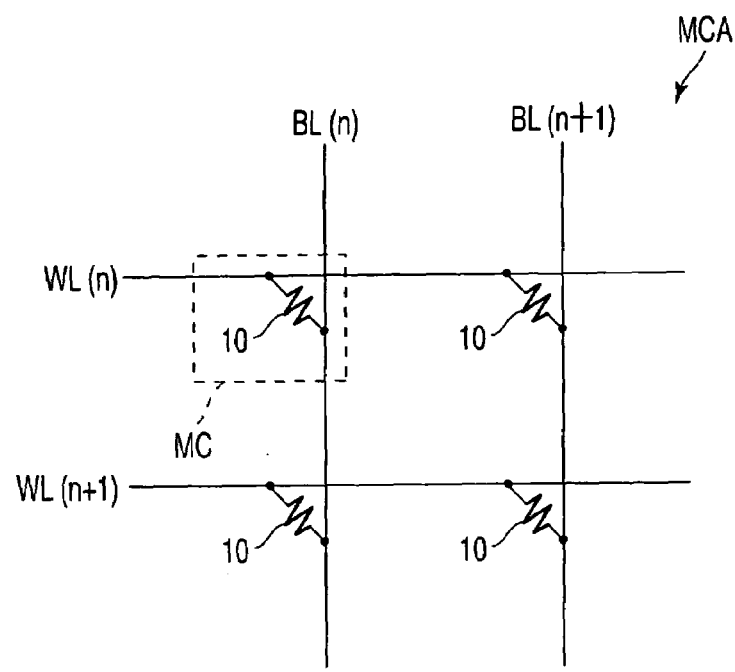
FIGS. 19A and 19B are views showing cross-point memory cells of the magnetic random access memory according to the embodiment of the present invention.
Figure 19B:
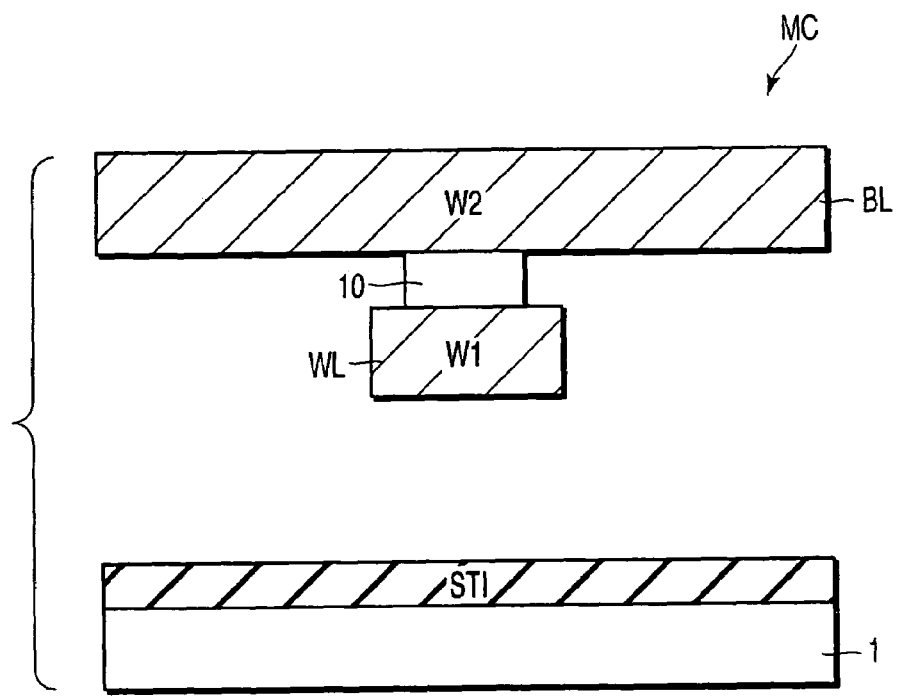

FIGS. 19A and 19B show a cross-point memory cell of the magnetic random access memory according to the embodiment of the present invention. The cross-point cell structure will be described below.

As shown in FIGS. 19A and 19B, one cell MC having a cross-point structure includes one MTJ element 10, the bit line BL, and the word line WL. The MTJ element 10 comprises the recording layer 15 including the ferromagnetic layers 15a and 15c with weak ferro-coupling. The axis of easy magnetization is oblique with respect to the running directions of the word line WL and bit line BL. The memory cell array MCA is formed by laying out a plurality of memory cells MC in an array.

More specifically, the MTJ element 10 is arranged near the intersection between the bit line BL and the word line WL. One terminal of the MTJ element 10 is connected to the word line WL. The other terminal of the MTJ element 10 is connected to the bit line BL.

The data write operation of the cross-point memory cell is the same as that of the select transistor cell. Anti-parallel switching is executed. In the data read operation, the read current Ir is supplied to the bit line BL and word line WL connected to the selected MTJ element 10, thereby reading out the data of the MTJ element 10.

[12] Asteroid Curve

Figure 20A:
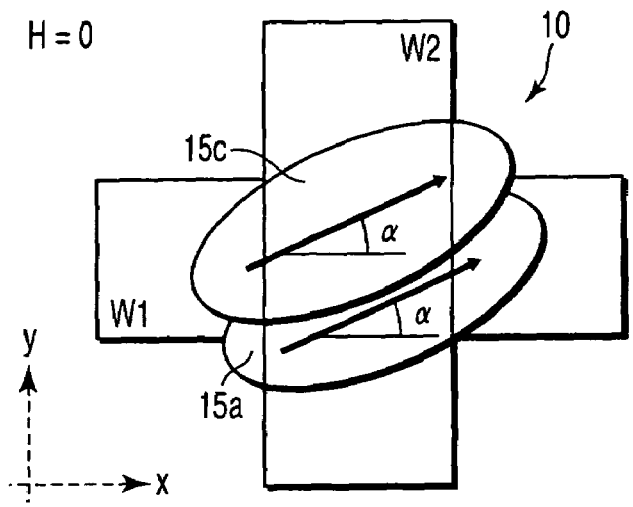
FIGS. 20A and 20B are views showing detailed examples of an asteroid curve according to the embodiment of the present invention.
Figure 20B:
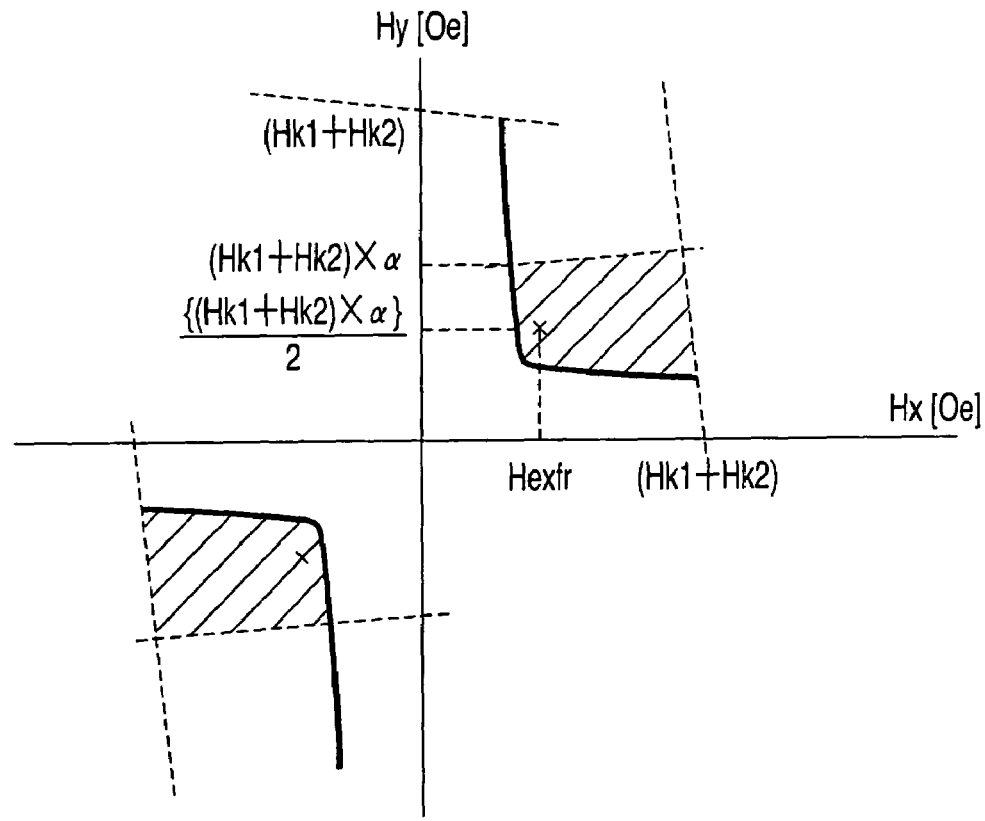

FIGS. 20A and 20B show detailed examples of the asteroid curve according to the embodiment of the present invention.

Within the parameter range most interest to the present inventors, an asteroid curve as shown in FIGS. 20A and 20B is obtained. The actual write point is represented by $Hx \approx Hexfr$ and $Hy \approx \{(Hk1+Hk2) \times \alpha\}/2$. The unit of $\alpha$ is radians. When $\alpha$ is set to 0.17 radians (10°), Hk1 and Hk2 are set to 100 [Oe] and 250 [Oe], and Hexfr is set to 25 [Oe], the write point is represented by $Hx \approx 25$ [Oe] and $Hy \approx 30$ [Oe]. The write current values can be 4 mA or less.

The write margin in the Hx direction is very wide (325 [Oe]). At a point more than $Hy \approx \{(Hk1+Hk2) \times \alpha\}/2$, the write is unstable. Hence, the actual write margin in the Hy direction is 30 [Oe] which is a sufficiently settable range.

[13] Effect

According to the embodiment of the present invention, the MTJ element 10 executes the anti-parallel switching write by using the recording layer 15 including the ferromagnetic layers 15a and 15c with weak ferromagnetic coupling. In the anti-parallel switching, the axis of easy magnetization of the MTJ element 10 is set obliquely with respect to the running directions (X-axis direction and Y-axis direction) of the first and second write wirings W1 and W2, and the magnetizations of the ferromagnetic layers 15a and 15c rotate in reverse directions with respect to the applied magnetic field and cause magnetization reversal. For this reason, in the magnetization reversal process, the magnetizations of the ferromagnetic layers 15a and 15c are set in the anti-parallel state (FIG. 3(c)). Since the magnetizations of the ferromagnetic layers 15a and 15c cancel each other, the magnetostatic energy does not increase. Hence, the reversal field of the MTJ element 10 in the write can be greatly decreased, and the write current value can be decreased.

Conventionally, when the short length of the MTJ element 10 is decreased to about 140 nm, the reversal field becomes excessively large, and the write current value cannot be set to a practical value ($10^7$ A/cm$^2$ or less on the current density basis). However, according to the embodiment of the present invention, even when the short length of the MTJ element 10 is greatly reduced to several tens of nm, high integration of the magnetic random access memory can be implemented within the range of practical write current value.

Following embodiments of the present invention were also made to realize the anti-parallel switching in MRAMs.

Figure 22:
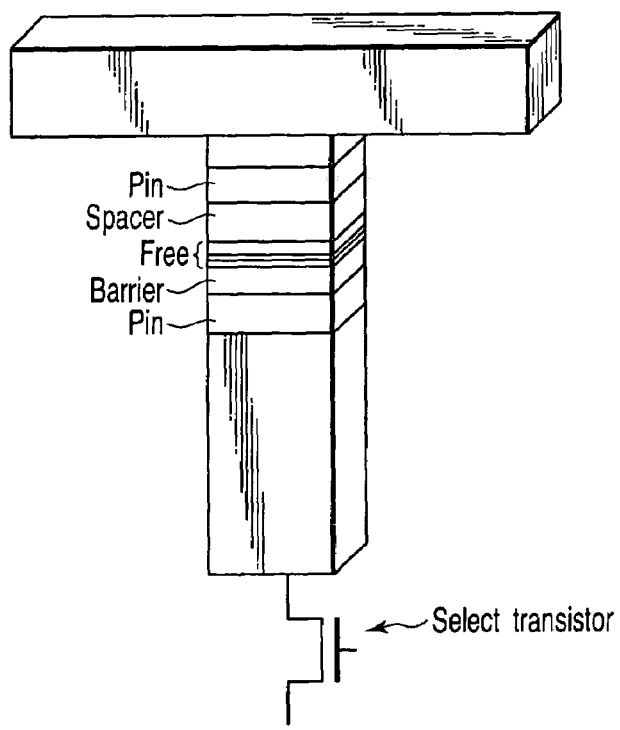
FIG. 22 is a view showing the magnetic random access memory according to the embodiment of the present invention.

As shown in FIG. 22, additional select transistors for writing are connected to the cells. MTJs of the cells have another pinned layer to generate spin-polarized electrons. The spin-polarized electrons, which helped the magnetization switching, are injected only to the selected cells. The spin-polarized electrons and the interaction by the magnetization of the free layer (the recording layer) use to rewrite the magnetization of the free layer. Additionally applying magnetic field also helped the switching. In this case, the problem of the selecting can be improved by injecting the spin-polarized electrons only to the selected cells.

Figure 23:
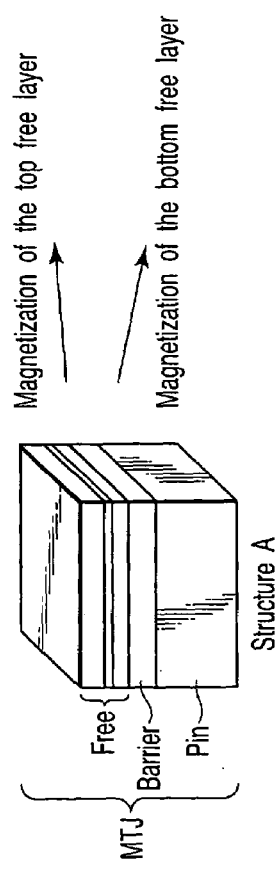
FIG. 23 is a view showing a structure A of the MTJ element according to the embodiment of the present invention.

Further, as shown in FIG. 23, the first magnetization of the top free layer and the second magnetization of the bottom free layer differ in direction in non-selecting. This also helped to realize the anti-parallel switching by rotating the first magnetization and second magnetization in reverse directions. The torque, T, induced by the injected polarized electrons is expressed by $T=-S2\times(S2\times S1)$ (here, S2 represents majority spin of the free layer and S1 does that of the pinned layer). The torque T acts to the magnetization of the free layer. In this embodiment, majority spin of the first magnetization of the top free layer, S21, and majority spin of the second magnetization of the bottom free layer, S22, are set different in direction. This resulted in opposite magnetization rotation for the top free layer and for the bottom free layer, since the $T1=-S21\times(S21\times S1)$ and $T2=-S22\times(S22\times S1)$ are opposite in direction (here, T1 represents torque induced in the top free layer and T2 does that in the bottom free layer).

Figure 24:
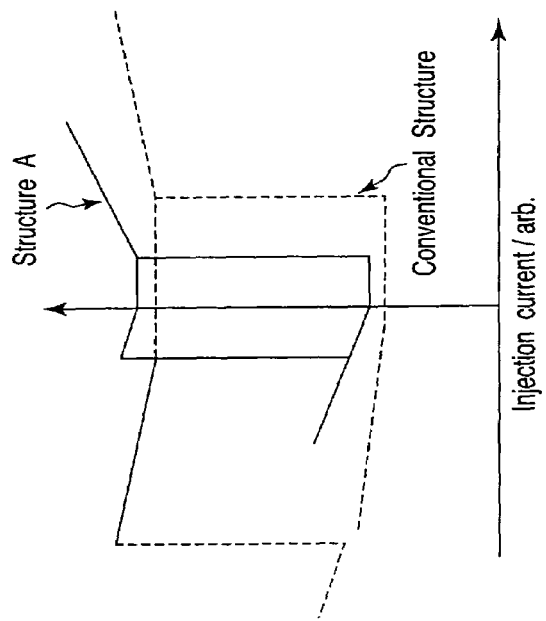
FIG. 24 is a view for explaining the structure A of the MTJ element according to the embodiment of the present invention.
Figure 24:
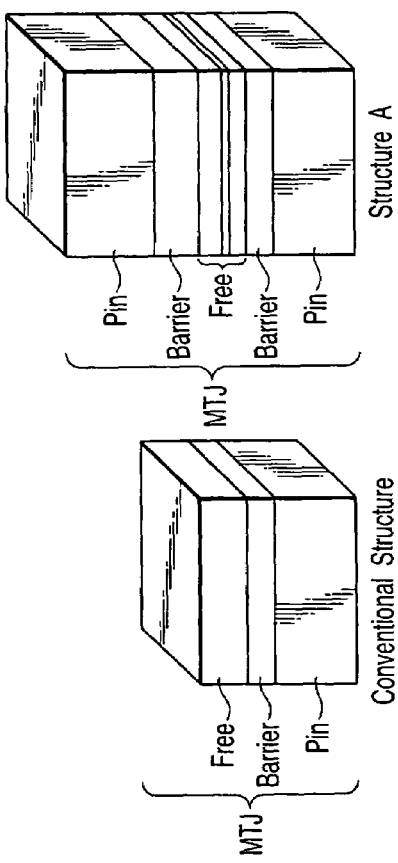

Furthermore, as shown in FIG. 24, the free layers are sandwiched by the magnetoresistive layers and the pinned layers on its both sides in order not only to center the R-H curve but to reduce the threshold current to less than estimated only by the anti-parallel switching.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
a first write wiring which runs in a first direction;
a second write wiring which runs in a second direction different from the first direction; and
a magnetoresistive element which is arranged at an intersection between the first write wiring and the second write wiring, has a fixed layer, a recording layer, and a magnetoresistive layer sandwiched between the fixed layer and the recording layer, and has an axis of easy magnetization obliquely with respect to the first direction and second direction, the recording layer including a first ferromagnetic layer, a second ferromagnetic layer, and a first nonmagnetic layer sandwiched between the first ferromagnetic layer and the second ferromagnetic layer, in which first magnetization of the first ferromagnetic layer and second magnetization of the second ferromagnetic layer are ferromagnetically coupled, and a ferro-coupling constant C of a ferromagnetic coupling is 0.0001 erg/cm$^2 \leq C \leq$ 0.2 erg/cm$^2$.

2. The device according to claim 1, wherein the first ferromagnetic layer and second ferromagnetic layer have different anisotropy magnetic fields.

3. The device according to claim 1, wherein the first ferromagnetic layer and second ferromagnetic layer have different induced magnetic anisotropy constants.

4. The device according to claim 1, wherein the first ferromagnetic layer and second ferromagnetic layer have different saturation magnetizations.

5. The device according to claim 1, wherein the first ferromagnetic layer and second ferromagnetic layer have different thicknesses.

6. The device according to claim 1, wherein an angle θ made by a direction of axis of easy magnetization with respect to one of the first direction and second direction is $0°<\theta\leq 30°$.

7. The device according to claim 1, wherein an angle θ made by a direction of axis of easy magnetization with respect to one of the first direction and second direction is $5°\leq\theta\leq 30°$.

8. The device according to claim 1, wherein an angle θ made by a direction of axis of easy magnetization with respect to one of the first direction and second direction is $5°\leq\theta\leq 10°$.

9. The device according to claim 1, wherein
the recording layer further comprises
a third ferromagnetic layer,
a second nonmagnetic layer sandwiched between the first ferromagnetic layer and the third ferromagnetic layer,
a fourth ferromagnetic layer, and
a third nonmagnetic layer sandwiched between the second ferromagnetic layer and the fourth ferromagnetic layer,
the first ferromagnetic layer and third ferromagnetic layer are anti-ferromagnetically coupled, and
the second ferromagnetic layer and fourth ferromagnetic layer are anti-ferromagnetically coupled.

10. The device according to claim 1, wherein
the fixed layer comprises
a third ferromagnetic layer,
a fourth ferromagnetic layer, and
a second nonmagnetic layer sandwiched between the third ferromagnetic layer and the fourth ferromagnetic layer, and
the third ferromagnetic layer and fourth ferromagnetic layer are anti-ferromagnetically coupled.

11. The device according to claim 1, wherein a planar shape of the magnetoresistive element has a first diagonal and a second diagonal longer than the first diagonal, and the axis of easy magnetization is given in a direction of the second diagonal.

12. A write method of a magnetic memory device which comprises
a first write wiring which runs in a first direction,
a second write wiring which runs in a second direction different from the first direction, and
a magnetoresistive element which is arranged at an intersection between the first write wiring and the second write wiring, has a fixed layer, a recording layer, and a magnetoresistive layer sandwiched between the fixed layer and the recording layer, and has an axis of easy magnetization obliquely with respect to the first direction and second direction, the recording layer including a first ferromagnetic layer, a second ferromagnetic layer, and a first nonmagnetic layer sandwiched between the first ferromagnetic layer and the second ferromagnetic layer, in which first magnetization of the first ferromagnetic layer and second magnetization of the second ferromagnetic layer are ferromagnetically coupled, and a ferro-coupling constant C of a ferromagnetic coupling is $0.0001 \text{ erg/cm}^2 \leq C \leq 0.2 \text{ erg/cm}^2$, comprising rotating the first magnetization and second magnetization in reverse directions to reverse the first magnetization and second magnetization, by supplying a first current and second current to the first write wiring and second write wiring, respectively, to apply magnetic fields by the first current and second current to the magnetoresistive element.

13. The method according to claim 12, wherein when the first current is supplied to only the first write wiring, a magnetization arrangement is obtained in which an axis by the first direction is sandwiched between the first magnetization and second magnetization.

14. The method according to claim 12, further comprising:
a first cycle in which the first current is supplied to only the first write wiring to apply a first magnetic field by the first current to the magnetoresistive element, obtaining a magnetization arrangement in which an axis by the first direction is sandwiched between the first magnetization and second magnetization,
a second cycle in which the first current is continuously supplied to the first write wiring, and the second current is supplied to the second write wiring to apply a second magnetic field by the first current and second current to the magnetoresistive element, making the first magnetization and second magnetization substantially antiparallel, and
a third cycle in which supply of the first current to the first write wiring is stopped, and supply of the second current to the second write wiring is stopped to reverse the first magnetization and second magnetization.

15. The method according to claim 12, wherein supply of the first current and supply of the second current to the first write wiring and second write wiring are started substantially simultaneously.

16. The method according to claim 12, further comprising:
a first cycle in which the first current is supplied to only the first write wiring to apply a first magnetic field by the first current to the magnetoresistive element, obtaining a magnetization arrangement in which an axis by the first direction is sandwiched between the first magnetization and second magnetization,
a second cycle in which the first current is continuously supplied to the first write wiring, and the second current is supplied to the second write wiring to apply a second magnetic field by the first current and second current to the magnetoresistive element, making the first magnetization and second magnetization substantially antiparallel,
a third cycle in which supply of the first current to the first write wiring is stopped, and the second current is continuously supplied to the second write wiring to apply a third magnetic field by the second current to the magnetoresistive element, and
a fourth cycle in which supply of the first current and second current to the first write wiring and second write wiring is stopped to reverse the first magnetization and second magnetization.

17. The method according to claim 12, wherein the first ferromagnetic layer and second ferromagnetic layer have different anisotropy magnetic fields.

18. The method according to claim 12, wherein the first ferromagnetic layer and second ferromagnetic layer have different induced magnetic anisotropy constants.

19. The method according to claim 12, wherein the first ferromagnetic layer and second ferromagnetic layer have different saturation magnetizations.

20. The method according to claim 12, wherein the first ferromagnetic layer and second ferromagnetic layer have different thicknesses.

21. A magnetic memory device comprising:
a first wiring which runs in a first direction;
a select transistor which feeds spin-polarized electrons;
a second wiring which runs in a second direction different from the first direction and which is selected by the select transistor; and
a magnetoresistive element which is arranged at an intersection between the first wiring and the second wiring, has a first fixed layer, a recording layer, and a first magnetoresistive layer sandwiched between the first fixed layer and the recording layer, the recording layer including a first ferromagnetic layer, a second ferromagnetic layer, and a first nonmagnetic layer sandwiched between the first ferromagnetic layer and the second ferromagnetic layer, in which first magnetization of the first ferromagnetic layer and second magnetization of the second ferromagnetic layer are ferromagnetically coupled, a ferro-coupling constant C of a ferromagnetic coupling is $0.0001 \text{ erg/cm}^2 \leq C \leq 0.2 \text{ erg/cm}^2$, and which is injected the spin-polarized electrons in writing.

22. The device according to claim 21, wherein directions the first and second magnetizations differ each other in non-selecting.

23. The device according to claim 21, wherein the magnetoresistive element has a second fixed layer and a second magnetoresistive layer sandwiched between the second fixed layer and the recording layer.

* * * * *